United States Patent [19]

Shibasaki et al.

[11] Patent Number: 5,430,310

[45] Date of Patent: Jul. 4, 1995

[54] FIELD EFFECT TRANSISTOR

[75] Inventors: Ichiro Shibasaki; Kazuhiro Nagase, both of Fuji, Japan

[73] Assignee: Asahi Kasei Kogyo Kabushiki Kaisha, Osaka, Japan

[21] Appl. No.: 949,525

[22] Filed: Nov. 25, 1992

[30] Foreign Application Priority Data

| Mar. 28, 1991 | [JP] | Japan | 3-064987 |
| Mar. 28, 1991 | [JP] | Japan | 3-064988 |
| Apr. 22, 1991 | [JP] | Japan | 3-090151 |
| Aug. 1, 1991 | [JP] | Japan | 3-192410 |

[51] Int. Cl.$^6$ .............................. H01L 29/78
[52] U.S. Cl. ............... 257/190; 257/194; 257/280; 257/472; 257/615
[58] Field of Search ............... 257/190, 192, 194, 201, 257/280, 288, 472, 613, 615, 618

[56] References Cited

U.S. PATENT DOCUMENTS 4,424,525  1/1984  Mimura .................... 357/23

FOREIGN PATENT DOCUMENTS

| 0196517A1 | 10/1986 | European Pat. Off. |
| 56-94780 | 7/1981 | Japan . |
| 59-53714 | 12/1984 | Japan . |
| 60-5572 | 1/1985 | Japan . |
| 60-144979 | 7/1985 | Japan . |
| 61-54673 | 3/1986 | Japan . |
| 61-131565 | 6/1986 | Japan . |
| 61-276267 | 12/1986 | Japan . |
| 63-272080 | 11/1988 | Japan . |
| 2-5439 | 1/1990 | Japan . |
| 2-229438 | 9/1990 | Japan . |

OTHER PUBLICATIONS

An InAs Channel Heterojunction Field-Effect Transistor With High Transconductance, Yoh et al, IEEE Electron Device Letters, 11(11):526–528 1990.

(InAs)$_3$(GaAs)$_1$ Superlattice Channel Field-Effect Transistor Grown By Molecular Beam Epitaxy, Nishiyama et al., Appl. Phys. Lett., 55(9):894–895 1989.

*Primary Examiner*—Mark V. Prenty
*Attorney, Agent, or Firm*—Finnegan, Henderson Farabow, Garrett & Dunner

[57] ABSTRACT

A field effect transistor including a first compound semiconductor layer (2) serving as a buffer layer, an InAs layer (3) serving as a channel layer, and a second compound semiconductor layer (4) serving as an electron donor layer or a barrier layer which are, in this order, deposited on a semiconductor substrate (1) having a lattice constant different from that of InAs. The first compound semiconductor layer (2) is formed from a material selected from AlGaAsSb, AlGaPSb, AlInAsSb and AlInPSb which are substantially in lattice matching with InAs and have a bandgap greater than that of InAs, and hence the first layer (2) has a simple structure. An FET having excellent high frequency characteristics can be obtained on the substrate (1) having a lattice constant different from that of the InAs layer (3).

32 Claims, 18 Drawing Sheets

FIELD EFFECT TRANSISTOR

TECHNICAL FIELD

The present invention relates to a field effect transistor (hereinafter referred to as "FET") suitable as an amplifying device for transmitting and receiving in the satellite broadcasting or a device for high speed data transfer.

BACKGROUND ART

As GHz band high frequency devices represented by an amplifying element for transmitting and receiving in the satellite broadcasting, there have widely been known, for instance, GaAs-MESFET (Metal Semiconductor FET) whose channel layer is a GaAs epitaxial layer deposited on a GaAs substrate, and FETs which make use of a two-dimensional electron layer accumulated in the interface of the hetero structure of GaAs and AlGaAs, i.e., so-called HEMT's (High Electron Mobility Transistors; Japanese Patent Application Laying-open No. 94780/1981). The GaAs device operates at a high speed for the reason that the electron mobility of GaAs is high on the order of about 8,000 cm$^2$/V. sec in its undoped state (intrinsic state), which is several times (5 to 6 times) greater than that of Si.

However, the channel layer of a GaAs-MESFET must be doped with impurities, and accordingly the electron mobility thereof is reduced to about 4,000 cm$^2$/V. sec owing to the scattering of conduction electrons by the impurities. To solve this problem, the GaAs-HEMT is designed to have a structure in which an electron donor layer doped with impurities and a channel layer are separated from one another through a heterojunction of different semiconductors having different bandgaps, whereby the scattering effect due to the impurities is reduced and a high electron mobility is established.

GaAs-HEMT's in which the relation between the impurity concentration and the film thickness of the electron donor layer thereof is specified are, for instance, disclosed in Japanese Patent Application Laying-open No. 53714/1984, U.S. Pat. No. 4,424,525 and U.S. Pat. No. Re. 33,584.

In the HEMT structure, it is difficult to form an ohmic electrode and to control the electron mobility since the impurity concentration in the channel layer is in general low. There has been proposed, in Japanese Patent Application Laying-open No. 54673/1986, a GaAs-FET in which both electron donor and channel layers forming a heterojunction are doped with impurities for the purpose of compensating the foregoing drawback.

In addition, Japanese Patent Application Laying-open No. 276267/1986 proposes a GaAs semiconductor heterojunction device whose region doped with impurities spreads into the region including a heterojunction in order to increase the concentration of two-dimensional electron gas.

Further, Japanese Patent Application Laying-open No. 131565/1986 proposes a double heterojunction GaAs-FET in which both upper and lower surfaces of an n-type channel layer make contact with electron donor layers of a compound semiconductor doped with impuritiers, which electron donor layers have energy bandgaps layer than that of the channel layer.

U.S. Pat. No. 4,424,525 proposes a GaAs-FET which makes use of the heterojunction and in which both electron donor and channel layers positioned below the source and drain of the GaAs-FET, respectively, are doped with impurities.

However, an FET having a very short gate length equal to or less than 0.2 μm is required for producing devices, from the above-mentioned devices, capable of transmitting and receiving radio waves of several tens of GHz region. Such a short gate electrode might sometimes be formed by the photolithography technique, but generally, the formation thereof requires an advanced technology, and stable production thereof is quite difficult.

Although the electron beam lithography has widely been adopted in practice, it is inferior to the photolighography technique from the viewpoint of industrial mass-productivity. Moreover, the gate length must be made more finer in order to produce high frequency devices capable of operating at a higher frequency region from the aforementioned GaAs-FETs such as GaAs-MESFETs and GaAs-HEMTs. However, if the gate length is made precise to obtain devices capable of operating at a higher frequency, the development of novel techniques and advanced processing techniques which are industrially impracticable are required. For this reason, the development of high frequency devices has been desired having novel structures which can be easily made precisely, mass-produced, and can cope with higher frequency bands as compared with those of the conventional devices.

Under such circumstances, Japanese Patent Application Laying-open No. 272080/1988 proposes the use of a thin film of InGaAs which has an electron mobility higher than that of GaAs as the channel layer for FETs. In the structure according to this proposal, a double heterojunction is formed by sandwiching the n-type InGaAs layer serving as a channel layer by different GaAs layers. This patent application discloses trial production examples in which both of these GaAs layers are doped and both of these layers are not doped. A GaAs plate is used as a substrate. In this proposal, the InGaAs layer directly comes in contact with the GaAs layers and, therefore, the atomic ratio of In content to As content in the InGaAs layer should be small in order to satisfy the requirement of lattice matching. The ratio should be limited within 20% in the examples of the foregoing proposal and the thickness of the InGaAs layer should also be thin on the order of 150 Å. If the rate of In is low as in the foregoing case, the mobility is not substantially improved as compared with GaAs.

Moreover, there have been studied FETs whose channel layer comprises a high-quality thin film of InAs having an electron mobility and a saturation speed overwhelmingly higher than those of GaAs.

The high electron mobility and saturation speed of InAs may allow for even FETs having a gate length longer than that of the GaAs-FET to transmit and receive high frequency radio waves to the same degree as the GaAs-FETs. However, these conventional attempts to develop InAs-FETs suffer from the following problems:

(1) Substrates to be used are expensive and thus are not suitable for use as industrial materials.
(2) The structure thereof is very complicated and problems relating to reliability and manufacturing processes arise.
(3) Such devices are liable to cause deffects due to the difference in lattice constant between the InAs layer and a semiconductor layer which comes in contact with the former.

(4) When InAs layers are deposited, in layers, on a semiconductor layer having a lattice constant different from that of the InAs layer, there is a limit in the thickness of the InAs layer which can be deposited in layers without causing any defect. No InAs layer having a thickness required for designing an FET has been obtained because the upper limit of the film thickness, i.e., the critical film thickness is small.

(5) A large stress is set up in the InAs layer due to a large difference between lattice constants of the InAs layer and a semiconductor layer which comes in contact with the InAs layer. This causes various problems such as thermal instability and large changes in properties with time and, therefore, the reliability of the resulting device is reduced.

(6) The resulting devices do not exhibit functions sufficient for use as high frequency devices because of, for instance, a high parasitic capacitance generated between the substrate and the InAs layer.

(7) A part of the material is very susceptible to oxidation. Therefore, the production method is quite complicated and the reliability of the device is insufficient.

(8) A suitable Schottky junction or a non-ohmic junction such as a pn junction cannot be obtained because of the small bandgap energy of InAs.

For instance, Japanese Patent Application Laying-open No. 5439/1990 proposes the use of an InAs substrate. However, the InAs substrate is expensive and is not readily acceptable for industrial purposes. In addition, since an insulating substrate cannot be obtained at room temperature, the resulting device may have a parasitic capacitance between the InAs substrate and a channel layer, which capacity is an obstacle in obtaining good high speed characteristics.

On the other hand, there has also been known devices comprising an InAs thin film directly formed on a substrate whose lattice constant is quite different from that of the InAs film. For instance, Japanese Patent Application Laying-open No. 229438/1990 discloses a double heterojunction InAs-FET prepared by forming a GaAs buffer layer on a GaAs substrate through the molecular beam epitaxy (MBE) method, directly forming an InAs layer as a channel layer on the GaAs buffer layer, and then forming a GaAs layer on the InAs layer. Since an InAs layer is formed on a GaAs substrate having a lattice constant quite different from that of the InAs layer in this structure, the thickness of the InAs layer which gives an InAs thin film of good quality is limited to not more than about 209 Å. This causes practical problems. For instance, it is an obstacle in designing a device having a high current-driving ability, or greatly restricts the degree of freedom in the design of devices.

As a method for relieving the lattice mismatching between a GaAs substrate and an InAs substrate, Japanese Patent Application Laying-open No. 5572/1985 proposes an InAs-FET which makes use of a stack of layers of GaSb and AlSb as a buffer layer. The difference between the lattice constants of GaSb and InAs is small and in the order of about 6%. However, it is not preferable to directly form an InAs thin film on the GaSb layer when producing an FET having an InAs layer serving as a channel layer, since, as shown in FIG. 1A, the upper edge of the valence band of a GaSb layer 102 is placed higher than the lower edge of the conduction band of an InAs layer 103. For this reason, an AlSb layer 104 is formed on the GaSb layer 102 as a current-barrier layer for electrically insulating the GaSb layer 102 from the InAs layer 103, and then the InAs layer 103 is formed on the AlSb layer 104 as shown in FIG. 1B. In this structure, however, the buffer layer is very complicated, and there is formed a parasitic capacitor which comprises the AlSb layer 104 serving as a dielectric film sandwiched between the GaSb layer 102 and the InAs layer 103 serving as electrodes as shown in FIG. 1C. Thus, this is not preferable as a structure for high speed devices. Moreover, since the difference in lattice constant between the AlSb layer 104 and the InAs layer 103 is as much as 1.25%, the critical film thickness of the InAs thin film 103 on the AlSb layer 104 cannot exceed 200 Å. This is also an obstacle in forming devices capable of operating at a large electric current. In addition, the AlSb film 104 is very susceptible to oxidation. This property of the AlSb film makes the processes for, for instance, forming an active layer through the mesa etching technique complicated and the resulting device possibly shows property changes with time due to the oxidation. Therefore, the proposal is not practicable and further does not disclose any method for inhibiting such oxidation.

As another method for relieving the lattice mismatching between a GaAs substrate and an InAs substrate, IEEE ELECTRON DEVICE LETTERS, 1990, Vol. 11, No. 11, NOVEMBER discloses an InAs-FET in which the channel layer is composed of an InAs layer formed on a buffer layer consisting of a stack of layers of AlSb and $Al_{0.5}Ga_{0.5}Sb$. The structure of the InAs-FET is shown in FIG. 2A. The discrepancy between the lattice constants of $Al_{0.5}Ga_{0.5}Sb$ and InAs is about 0.9%, and the critical film thickness of $Al_{0.5}Ga_{0.5}Sb$ is not more than 300 Å. This is also an obstacle in forming devices capable of operating at a high current. Moreover, in this example, an AlSb layer having a thickness of as thick as 2.8 μm is used as a buffer layer positioned between a substrate and an $Al_{0.5}Ga_{0.5}Sb$ layer, and the device has a complicated layer structure such that an AlSb layer of 60 Å thickness is inserted between the InAs layer and the $Al_{0.5}Ga_{0.5}Sb$ layer in order to increase the carrier concentration in the channel layer. Further, since the carriers in the channel layer are supplied from donor impurities which are unintentionally doped into the AlSb layer, or from the interface between the AlSb layer and the InAs layer, it is difficult to control the carrier concentration to agree with the design level of this FET. Thus, this technique has poor practicability since it has a problem in the industrial mass-production. FIG. 2B shows current-voltage characteristics of the InAs-FET fabricated according to the foregoing method. This device shows the pinch-off effect, but has poor linearity in the saturation region. In addition, the impact-ionization effect is conspicuous although it has a considerably long gate of 1.7 μm. Therefore, this technique is impracticable as well.

There has been proposed an InAs-FET having a structure in which an InAs layer is sandwiched between AlGaAsSb layers whose lattice constant is approximately consistent with that of the InAs layer (Japanese Patent application Laying-open No. 144979/1985). The device of this proposal comprises on a semi-insulated InP substrate a buffer layer having a multi-layered structure of InGaAs in which the compositions and the lattice constants of the layers stepwise vary. This multi-layered structure is designed such that the lattice constants of the layers change stepwise from the lattice constant of the InP substrate to that of the InAs layer. Thereafter, a stack of films in which an InAs layer is sandwiched between AlGaAsSb layers is formed on the buffer layer. The AlGaAsSb layer is used as a barrier layer for confining conduction electrons within the InAs layer. The structure of the InAs-FET thus produced is very complicated and is not preferable from the viewpoint of production thereof. Moreover, the upper most InGaAs layer of the InGaAs multi-layered film serving as the buffer layer has properties quite similar to those of InAs and a bandgap approximately equal to that of InAs, and is a conductive material at ordinary temperature. This leads to the formation of a parasitic capacitor in which the AlGaAsSb layer serves as a dielectric film, and the InAs layer serving as the channel layer and the InGaAs layer serving as the buffer layer act as electrodes and, as a result, good high frequency characteristics cannot be obtained. In addition, since an ohmic contact is formed if a gate electrode directly comes in contact with an InAs layer, the structure must be designed such that this direct contact is prevented when an active region is formed by the mesa separation method. However, this reference does not disclose any such structure at all. In addition, the AlGaAsSb film is quite susceptible to oxidation when the content of Ga component is low and thus it is essential to take a proper measure for preventing oxidation of the AlGaAsSb film when an active region is formed by the mesa etching method or when a device has a structure in which the AlGaAsSb film on the InAs film is exposed. The proposal, however, does not disclose any means for preventing the oxidation.

As has been discussed above, although there have been many attempts which makes use of InAs having a high electron mobility as a channel layer of FETs, an FET structure that can be practically acceptable has not yet been proposed.

DISCLOSURE OF THE INVENTION

An object of the present invention is to provide an FET having good high frequency characteristics suitable as an amplifying device for transmitting and receiving in the satellite broadcasting and as a device for high speed data transfer.

To accomplish this object, the FET according to the present invention has a structure which comprises a first compound semiconductor layer serving as a buffer layer and an InAs layer serving as a channel layer, which are stacked in this order on a semiconductor substrate having a lattice constant different from that of InAs.

InAs used as the channel layer in the present invention shows much higher electron mobility and saturation speed than those of GaAs usually used as channel layers of high frequency FETs. Moreover, the temperature dependency thereof is appropriately low and, therefore, it has been anticipated as a material for future type high speed devices which surpass the GaAs-FET. In particular, from the practical viewpoint, the development of a technique has been desired for forming a high-quality crystalline thin film of InAs on a general-use GaAs or Si substrate.

The GaAs or Si substrate has a lattice constant quite different from that of InAs. Therefore, if an InAs layer is formed on these substrate, the InAs layer of several atomic layer thickness exceeds the critical thickness, and accordingly lattice defects would be caused. For this reason, an insulating buffer layer must be formed between the substrate and the InAs thin film to obtain a high-quality InAs thin film. It is of course desirable that the buffer layer ensure the substantial lattice matching with the InAs layer and has a smooth surface free of defects. It is also desirable, from the viewpoint of production and reliability of the resulting device, that the buffer layer have simple structure to be thermally stable and free of property changes with time, that it can prevent the occurrence of any substrate leakage current, that it have a structure having only a low parasitic capacitance and that the layer be an electric insulator.

On the basis of the finding of a simple-structure semiconductor layer which satisfies the foregoing requirements as a material for buffer layers, the present invention provides a completely novel FET structure having superior high frequency characteristics, which comprises a substrate having a lattice constant different from that of an InAs layer, a buffer layer and an InAs layer serving as an active layer formed on the buffer layer.

The material for the first compound semiconductor layer is selected from AlGaAsSb, AlGaPSb, AlInAsSb and AlIbPSb which ensure the substantial lattice matching with the InAs layer and have bandgaps greater than that of the InAs layer, and the first compound semiconductor layer has a simple structure.

The structure of the buffer layer can be simplified on the basis of the finding that the first compound semiconductor layer, like an AlGaAsSb layer, of only a few tens of atomic layers can absorb the stress generated by the lattice mismatching between the substrate and the InAs layer, and can form a smooth surface. Thus, a high-quality InAs thin film having few defects such as lattice defects could be formed on a widely used GaAs or Si substrate. Moreover, the critical film thickness of the InAs layer is large enough to implement a film thickness required by the design specifications of the FET. Thus, a device could be obtained in which the stress applied to the interface of the InAs layer is small, and which has high reliability, high thermal stability and little property change with time. In addition, since a parasitic capacitance generated between the InAs layer and the substrate is small, a device of superior properties suitable for use as a high frequency device was obtained. Materials used partially include those susceptible to oxidation, but the oxidation could be prevented by mesa structure side walls or protective films. With regard to Schottky junctions, some methods for facilitating the formation thereof are implemented, and thus FETs having superior high frequency characteristics could be produced.

In the FET according to the present invention, an InAs layer is used as a channel layer. The electron mobility and saturation speed of the InAs layer are greater than those of GaAs and, therefore, the resulting device can be operated even at a higher frequency if the gate length is the same as that of devices using GaAs. Accordingly, it is sufficient that the gate length of the FETs according to the present invention is twice that of the conventional GaAs-HEMT at the same driving frequency. This makes the processing of gates much easier. More specifically, there is a large gap between the dimensional accuracy in the processing of 0.6 μm or larger which can be processed by the photolithography using a stepper and the accuracy of finer processing, and the latter is much complicated. According to the present invention, therefore, devices capable of operating at an ultra-high frequency can be easily produced by the photolighography process using ultraviolet rays. Further, when the gate length is the same as that of the conventional devices, the device can operate at a frequency two times higher than that used in the conventional GaAs-FET due to the high electron mobility of InAs. Moreover, the yield of the process is high and these devices can be mass-produced.

BRIEF DESCRIPTION OF THE DRAWINGS

FIGS. 1A to 1C are diagrams for conventional FETs comprising a stacked structure of GaSb and AlSb as described in Japanese Patent Application Laying-open No. 5572/1985, wherein FIG. 1A shows a band diagram observed when GaSb and InAs are directly joined, FIG. 1B shows a stacked structure of the FET, and FIG. 1C is a band diagram for the stacked structure shown in FIG. 1B;

FIG. 8A is a cross sectional view of Variation 1 of the foregoing embodiment in which a second compound semiconductor layer 4 serving as an insulating barrier layer is not doped with any donor impurity and only the InAs layer serving as the channel layer is doped with the donor impurity, FIG. 8B is a cross sectional view of Variation 2 of the foregoing embodiment in which the InAs layer is not doped with any donor impurity, and only the second compound semiconductor layer is doped with donor impurity so as to serve as an electron donor layer for the InAs layer, and FIG. 8C is a cross sectional view of Variation 3 of the foregoing embodiment in which both the second compound semiconductor layer and the InAs layer are doped with donor impurities and in which current carriers are conduction electrons supplied from the impurities present in the InAs layer and conduction electrons supplied from the second compound semiconductor layer 4;

FIG. 15A is a cross sectional view of the FETs as Variations 10 and 11 of the foregoing embodiment in which first to fourth semiconductor insert layers are disposed, and FIG. 15B is a cross sectional view of the FET as the Variation 10 of the foregoing embodiment in which an insulating layer is disposed below the gate electrode;

FIG. 16A is a plan view, FIG. 16B is a cross sectional view taken along the line A–B and FIG. 16C is a cross sectional view taken along the line C–D;

BEST MODE FOR CARRYING OUT THE INVENTION

The inventors of this invention have conducted studies of a novel structure InAs-FET comprising a buffer layer formed on an insulating substrate having no lattice matching with InAs in order to substantially ensure the lattice matching with an InAs layer, and to absorb strains due to the lattice mismatching between the substrate and the InAs layer. As a result, the inventors have found a structure comprising an AlGaAsSb layer formed on a substrate having no lattice matching with InAs, and an InAs layer formed on the AlGaAsSb layer which is one of the compound semiconductors capable of ensuring substantial lattice matching with InAs and having a bandgap greater than that of InAs. According to this structure, it has been found that the lattice mismatching between the substrate and the InAs layer can be relieved through the AlGaAsSb layer having a thickness corresponding to only several tens of monoatomic layers, that a high-quality InAs layer can be obtained, that disturbance in the lattice near the interface between the substrate and the AlGaAsSb layer is small, and that the parasitic capacitance of the resulting FET is also low. Moreover, it has also been found that there are some other compound semiconductors showing similar effect. Thus, an InAs-FET having good properties which have not conventionally been accomplished could be obtained by applying these compound semiconductors onto a substrate as a buffer layer, then forming an InAs layer on the buffer layer and further forming, on the InAs layer, a layer of a compound semiconductor which substantially ensure the lattice matching with the InAs layer. In this structure, the buffer layer serves to relieve the lattice mismatching between the substrate and the InAs layer.

EXAMPLE 1

Figure 3:
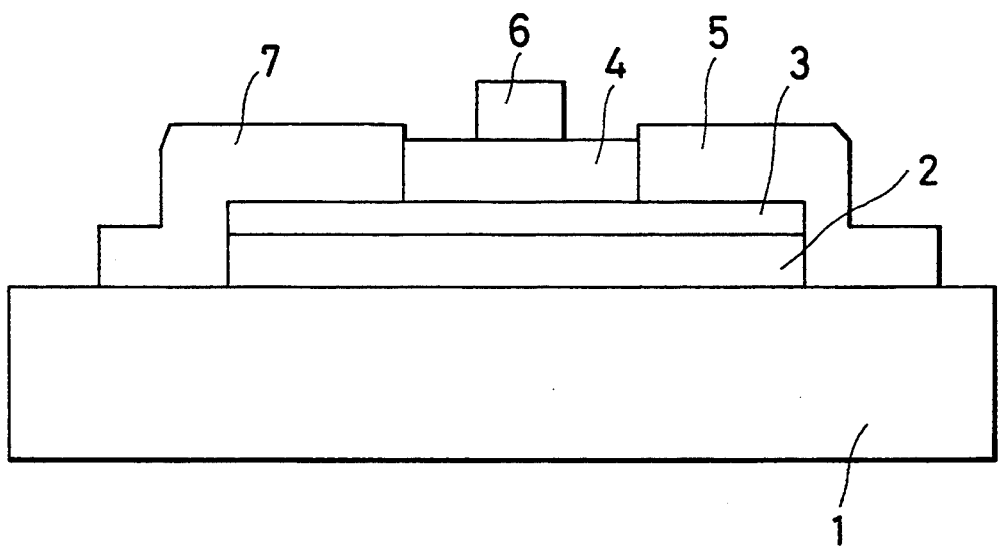
FIG. 3 is a cross sectional view showing the structure of an embodiment of the FET according to the present invention.

An embodiment of the field effect transistor according to the present invention will hereinafter be explained with reference to FIG. 3. In FIG. 3, reference numeral 1 represents a substrate, 2 represents a first compound semiconductor layer, 3 represents an InAs layer and 4 represents a second compound semiconductor layer. Further, reference numerals 5 and 7 represent a pair of ohmic electrodes, i.e., source electrode and drain electrode respectively. Reference numeral 6 represents a gate electrode formed between source electrode 5 and drain electrode 7. Each structural element will be detailed below.

Substrate 1

Substrate 1 used in the present invention may be any substrate having a lattice constant different from that of InAs, but preferred examples thereof include a GaAs substrate, a GaP substrate, an Si substrate having a single crystal GaAs grown on its surface, or a sapphire substrate. Among these, GaAs substrates are particularly preferred because they provide high-quality semi-insulating single crystal substrates. The term "semi-insulating substrate" herein used means those having a resistivity of $10^7$ Ω·cm or higher. If a single crystal is used, preferred orientations of plane are, for instance, (100), (111) and (110). It is also possible to use those which are shifted at an angle of 1° to 5° from these planes. Among these, the (100) plane is most preferred for growing a high-quality thin film. The substrate used in the present invention may be one having the same semiconductor material grown thereon for the purpose of smoothening and cleaning the surface of the substrate, as has been well-known in the art. A most typical example thereof is a GaAs substrate having a GaAs crystal grown thereon. The present invention can achieve superior effect than the conventional methods when a substrate having a lattice constant different from that of InAs is used. In particular, since the substrates having a lattice constant different from that of InAs by at least 3.5% include a variety of substrates such as a GaAs substrate and an Si substrate, which are preferred from the viewpoint of purity of crystals, smoothness and cost thereof, the superiority of the present invention over the conventional methods becomes conspicuous when these substrates are employed.

First Compound Semiconductor Layer 2

A preferred first compound semiconductor layer 2 is such that satisfies the following requirements:
(a) the layer substantially makes the lattice matching with the InAs layer;
(b) it can provide a smooth surface having few defects even when directly deposited on a substrate such as a GaAs substrate having a lattice constant greatly different from that of InAs layer 3;
(c) it has few crystal defects near the interface between the layer and the substrate, which can cause a parasitic capacitance or the like; and
(d) it can form a barrier for preventing a substrate leakage current at the interface between the InAs layer and the compound semiconductor layer.

Figure 4:
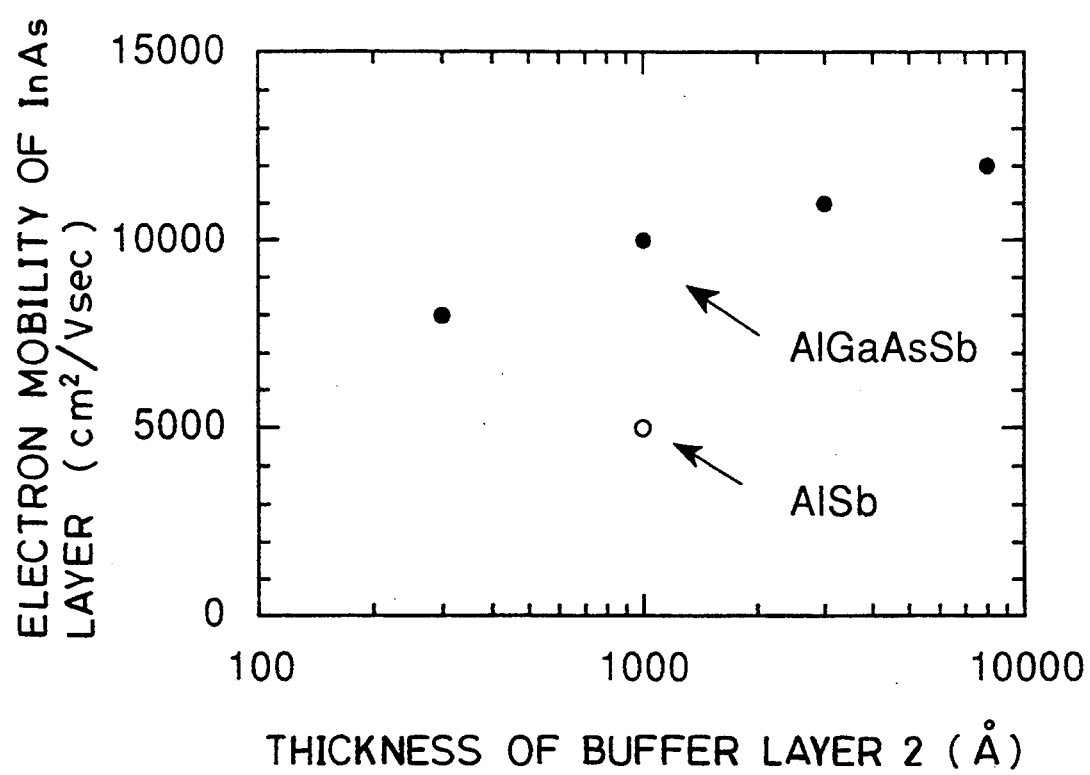
FIG. 4 is a graph showing the electron mobility of InAs observed when a layer of AlGaAsSb is formed on a GaAs substrate as a buffer layer of an InAs layer.

In FIG. 4, the closed circles represent the dependence of electron mobility of InAs layer 3, which is formed on AlGaAsSb layer 2 to a thickness of 300 Å, on the film thickness of AlGaAsSb layer 2 directly formed on GaAs substrate 1 through the MBE technique. The open circle depicted on FIG. 4 represents the electron mobility of InAs layer 3 of 300 Å thickness formed on an AlSb layer which is directly deposited on a GaAs substrate, for the purpose of comparison. In this case, the thickness (300 Å) of the InAs layer formed on the AlSb layer exceeds the critical film thickness, and hence, the electron mobility thereof is impaired. The InAs layer 3 formed on the AlGaAsSb layer 2 has a high electron mobility when the thickness AlGaAsSb layer 2 is 0.1 μm or more, and the electron mobility thereof is already considerably high even at a thickness of about 300 Å. This result, in combination with the results of RHEED (REFLECTION HIGH ENERGY ELECTRON DIFFRACTION) and X-ray diffraction analysis or the like, indicates that the AlGaAsSb layer 2 having a film thickness of 0.1 μm or more has not only a very smooth surface, but also good crystallinity free of defects over most of the regions of the film except for the region separated about 100 Å apart from the interface between the GaAs substrate and the layer 2. AlGaPSb, AlGaAsSb and AlInPSb also exhibit similar characteristics.

These four kinds of compound semiconductors, $Al_{x1}Ga_{1-x1}As_{y1}Sb_{1-y1}$, $Al_{x2}In_{1-x2}As_{y2}Sb_{1-y2}$, $Al_{x3}In_{1-x3}P_{y3}Sb_{y3}$ and $Al_{x4}Ga_{1-x4}P_{y4}Sb_{1-y4}$ can satisfy these requirements if the compositional ratios thereof are properly selected. The range of the acceptable compositional ratios can be determined according to the following three different methods.

I. First Method

A first method satisfies the following two requirements:
(1A) the lattice constant of the first compound semiconductor layer 2 agrees with that of the InAs layer 3 within a deviation of 0.6%; and
(2) the first compound semiconductor layer 2 has a bandgap of at least 1 eV such that it forms a potential barrier required for confining conduction electrons present in the InAs layer 3 in the InAs layer 3 itself.

Figure 5:
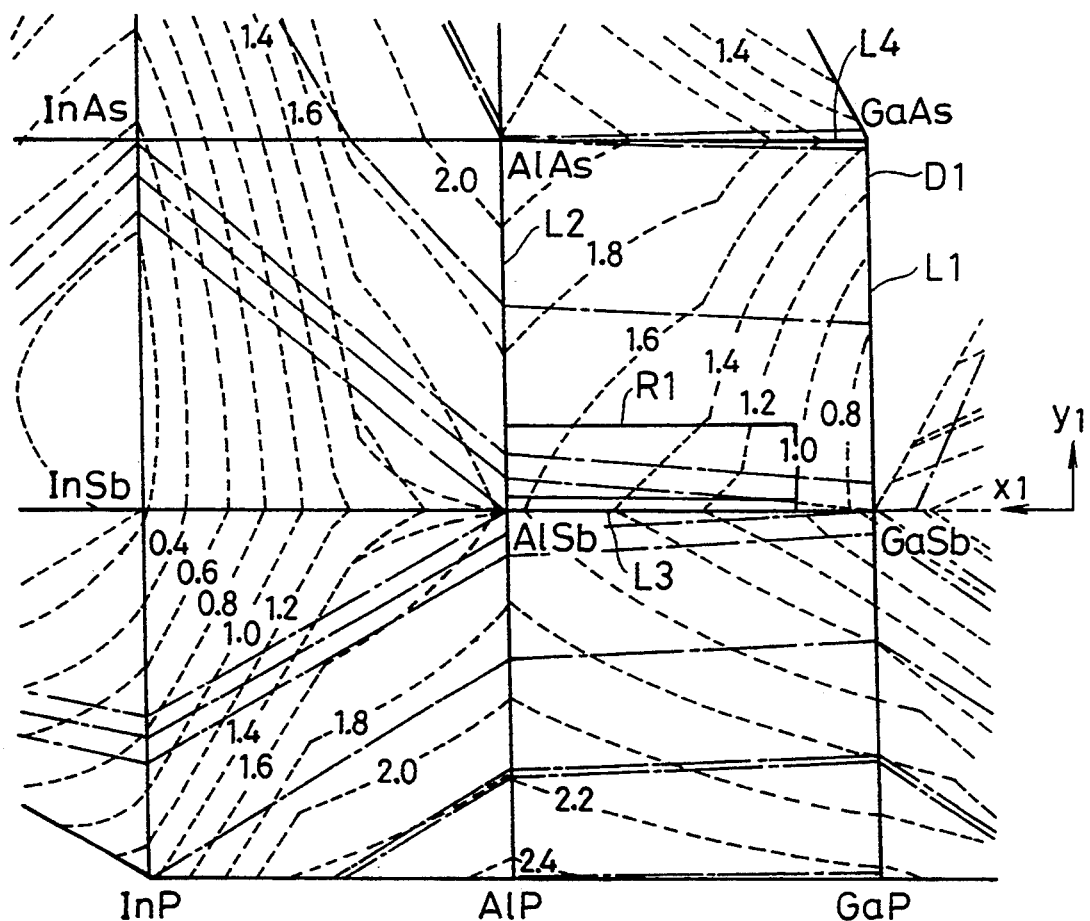
FIG. 5 is a phase diagram showing the relation between the compositions, bandgaps and lattice constants of a 4-component system compound semiconductor AlGaAsSb, which is disclosed in J.J.A.P., 1980, Vol. 19, p. 1675.

The only compound semiconductor having a lattice constant consistent with that of the InAs layer 3 within a deviation of 0.6 % is InAs among the binary systems of Group III-V elements. However, it is considered that the lattice matching within a deviation of 0.6 % is required in order to form a thin film of InAs deposited on the first compound semiconductor layer 2, which has an appropriate critical film thickness and thermal stability, and is free of stress which can cause property changes with time. FIG. 5 is a phase diagram of quaternary systems of Group III-V elements which satisfy this requirement.

In the phase diagram shown in FIG. 5, each composition of the compound semiconductor of formula $Al_{x1}Ga_{1-x1}As_{y1}Sb_{1-y1}$ is represented by a point within a square region D1 enclosed by four lines connecting AlAs, AlSb, GaSb and GaAs. In this region D1, the value x1 varies from 0 to 1 in proportion to the distance from a line L1 connecting GaAs and GaSb, and is 1 on a line L2 connecting AlAs and GaSb. The value y1 varies from 0 to 1 in proportion to the distance from a line L3 connecting AlSb and GaSb, and is 1 on a line L4 connecting AlAs and GaAs. The broken lines and the dashed-and-dotted lines in FIG. 5 are contour lines of the bandgap of compound semiconductors having a composition and a compositional ratio represented by each point, and contour lines of the lattice constants thereof, respectively.

A rectangular region R1 depicted by solid lines in FIG. 5 corresponds to a region including $Al_{x1}Ga_{1-x1}As_{y1}Sb_{1-y1}$ which satisfies the foregoing requirements (1A) and (2). This region can be defined by $\{0.21 \leq x1 \leq 1.0; \ 0.02 \leq y1 \leq 0.22\}$. In the same manner, each rectangular region including the composition of the compound semiconductor $Al_{x2}In_{1-x2}As_{y2}Sb_{1-y2}$, $Al_{x3}In_{1-x3}P_{y3}Sb_{1-y3}$ or $Al_{x4}Ga_{1-x4}P_{y4}Sb_{1-y4}$ which satisfies the foregoing requirements (1A) and (2) can be defined by $\{0.34 \leq x2 \leq 1.0; \ 0.09 \leq y2 \leq 0.79\}$, $\{0.07 \leq x3 \leq 1.0; \ 0.06 \leq y3 \leq 0.72\}$ or $\{0.13 \leq x4 \leq 1.0; \ 0.13 \leq y4 \leq 0.18\}$, respectively. More strictly, the ranges of the compositional ratios for the foregoing four kinds of compound semiconductors which satisfy the foregoing requirements (1A) and (2) can be defined by the following relations:

$\{0.21 \leq x1 \leq 1.0; \ 0.09x1 \leq y1 \leq 0.07x1 + 0.15\}$;
$\{0.34 \leq x2 \leq 1.0;$
$-0.82x2 + 0.91 \leq y2 \leq -0.87x2 + 1.09\}$;
$\{0.07 \leq x3 \leq 1.0;$
$-0.57x3 + 0.63 \leq y3 \leq -0.58x3 + 0.76\}$; and
$\{0.13 \leq x4 \leq 1.0; \ 0.06x4 \leq 0.06x4 + 0.12\}$

II. Second Method

A second method satisfies the following two requirements so as to ensure a range providing a higher quality InAs layer 3.

(1B) The lattice constant of the first compound semiconductor layer 2 agrees with that of the InAs in the InAs layer 3 within a deviation of 0.4%; and (2) the first compound semiconductor layer 2 has a bandgap of at least 1 eV such that the layer forms a potential barrier required for confining conduction electrons present in InAs layer 3 in the InAs layer 3 itself.

The ranges of the compositional ratios for the foregoing four kinds of compound semiconductors which satisfy the foregoing requirements (1B) and (2) can be defined by the following relations on the basis of FIG. 5:

$\{0.21 \leq x1 \leq 1.0; \ 0.08x1 + 0.03 \leq y1 \leq 0.08x1 + 0.12\}$
for $Al_{x1}Ga_{1-x1}As_{y1}Sb_{1-y1}$;
$\{0.34 \leq x2 \leq 1.0;$
$-0.83x2 + 0.94 \leq y2 \leq -0.86x2 + 1.06\}$ for $Al_{x2}In_{1-x2}As_{y2}Sb_{1-y2}$;
$\{0.07 \leq x3 \leq 1.0;$
$-0.57x3 + 0.65 \leq y3 \leq -0.58x3 + 0.74\}$ for $Al_{x3}In_{1-x3}P_{y3}Sb_{1-y3}$ and
$\{0.13 \leq x4 \leq 1.0; \ 0.06x4 + 0.024 \leq y4 \leq 0.06x4 + 0.10\}$ for $Al_{x4}Ga_{1-x4}P_{y4}Sb_{1-y4}$.

III. Third Method

The third method satisfies the following two requirements:

(1C) The critical film thickness of the InAs layer 3 formed on the first compound semiconductor layer 2 is set at least equal to a film thickness of the InAs layer that achieves the maximum mutual conductance of the FET which employs the InAs layer 3 as the channel layer; and (2) the first compound semiconductor layer 2 has a bandgap of at least 1 eV such that the layer forms a potential barrier required for confining conduction electrons present in the InAs layer 3 in the InAs layer 3 itself.

Figure 6:
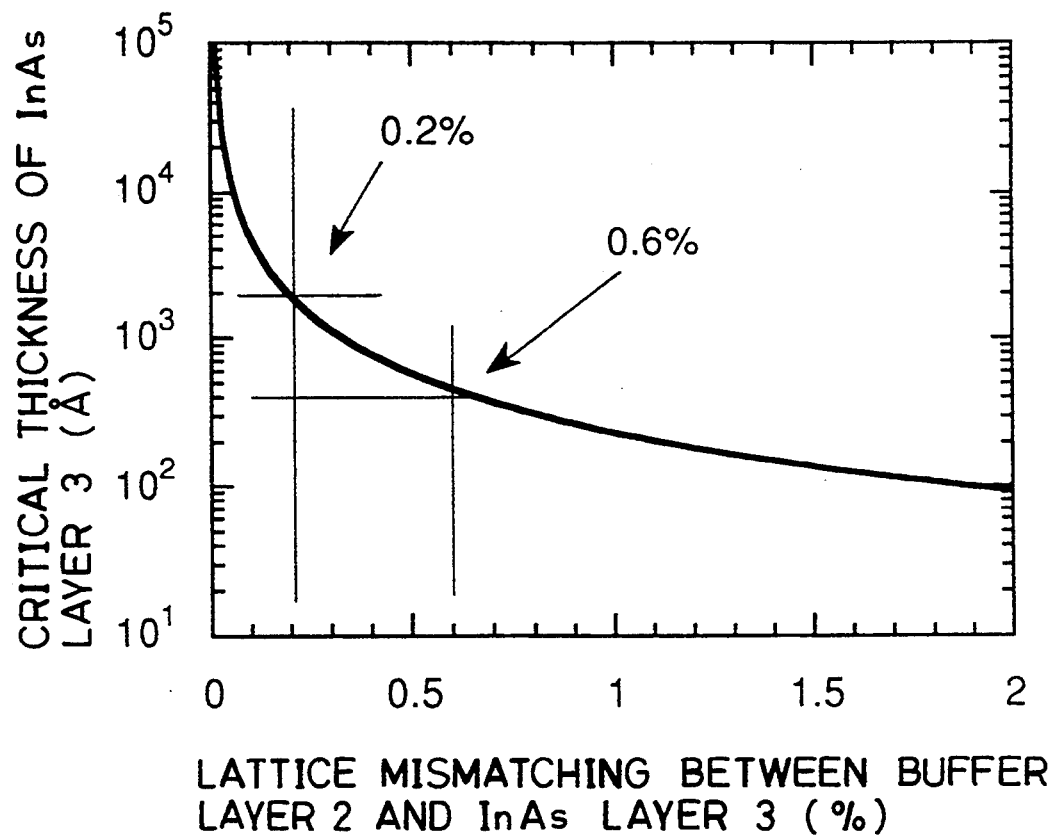
FIG. 6 is a graph illustrating the calculated critical thickness of an InAs layer against the magnitude of the lattice mismatching between the InAs layer and a first compound semiconductor layer serving as a buffer layer.

FIG. 6 schematically shows the relation between the critical film thickness of the InAs layer 3 and the degree of mismatching of the lattice constant of the AlGaAsSb layer 2 with respect to that of InAs. AlGaPSb, InGaAsSb and InGaPSb exhibit approximately similar characteristics.

As shown in FIG. 6, the use of the thickest channel layer requires the highest degree of lattice matching. In the present invention, however, the preferred upper limit of the required film thickness of the channel layer is defined at the thickness which gives the maximum mutual conductance of the FET.

The magnitude of the mutual conductance of the FET is approximately proportional to the product $\mu N_D a$, of the mobility $\mu$, the donor concentration $N_D$ and the film thickness a of the channel layer, which are observed under the biased conditions where the mutual conductance has a maximum value. In order to obtain an FET having a large mutual conductance, the FET must have such a structure as giving a large product $\mu N_D a$. Assuming that a voltage difference between the upper and lower surfaces of the channel layer 3 required for making the channel layer 3 a depletion layer by vertically applying the voltage to the channel layer 3 is $V_{off}$, the voltage difference $V_{off}$ increases in proportion to the donor concentration $N_D$ and the film thickness a. In FETs, it is preferred to control the value $V_{off}$ to $\frac{1}{4}$ times the breakdown voltage $V_B$ between the source and drain on the channel layer 3.

Figure 7:
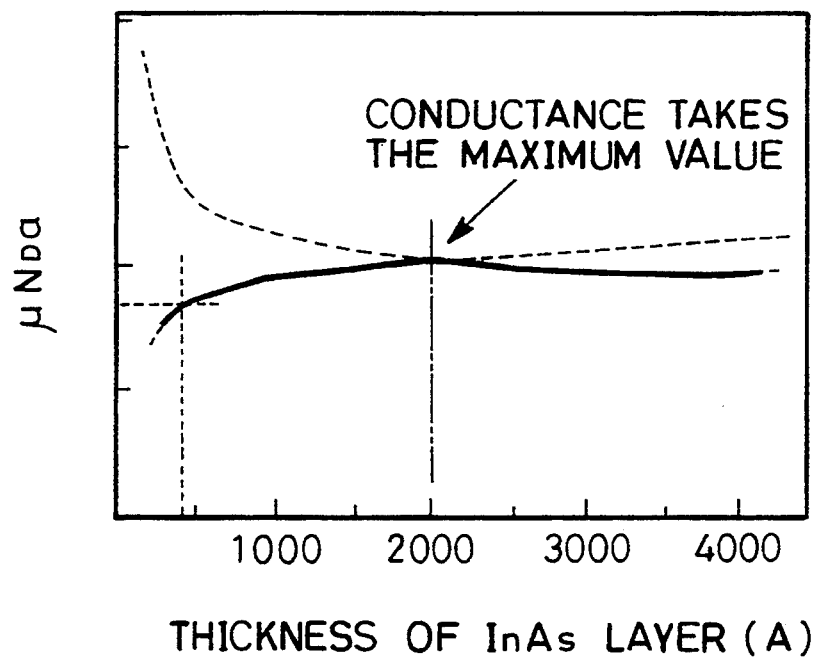
FIG. 7 is a graph showing the results of calculated relation between the film thickness of the InAs layer and the mutual conductance of the resulting FET.

FIG. 7 is a graph schematically showing the dependence of the product $\mu N_D a$ on the thickness a. The product $\mu N_D a$ for each specific film thickness a is given by determining the donor concentration $N_D$ so that the voltage $V_{off}$ becomes $\frac{1}{4}$ times the breakdown voltage $V_B$, taking into consideration the dependence of the breakdown voltage $V_B$ and the mobility $\mu$ on the donor concentration $N_D$. The product $\mu N_D a$ has a maximum near the film thickness a of 2,000 Å, and at this point, it shifts from an increasing function to a decreasing function. This indicates that the thickness of the InAs layer 3 of practical devices can be determined at a value equal to or less than 2,000 Å. In addition, it is also found that the film thickness of about 400 Å gives the mutual conductance of about 80% of the maximum value thereof, as seen from FIG. 6.

The following requirement can be obtained from FIG. 5.

(3) In order to implement the InAs channel layer 3 having a critical film thickness of 2,000 Å, the compositional ratios of the AlGaAsSb layer 2 must be determined in such a manner that the lattice constant of the AlGaAsSb layer 2 is separated apart from that of InAs not more than 0.2%.

It is found that the compositional ratios of the AlGaAsSb layer 2 should be determined such that the lattice constant of the AlGaAsSb layer 2 is separated apart from that of InAs not more than 0.6 % in order to obtain the InAs channel layer 3 having a critical film thickness of 400 Å. Results similar to those discussed above can be obtained when one of the AlGaPSb, InGaAsSb and InGaPSb are used as a material for the first compound semiconductor layer 2.

In order to obtain an FET having a higher mutual conductance, the composition of the first compound semiconductor layer 2 must fulfill not only the foregoing requirements (1C) and (2), but also the requirement (3), and such compositions can be determined on the basis of the phase diagram shown in FIG. 5. Results thus obtained are as follows:

$\{0.21 \leq x1 \leq 1.0;\ 0.08x1+0.05 \leq y1 \leq 0.08x1+0.10\}$ for $Al_{x1}Ga_{1-x1}As_{y1}Sb_{1-y1}$;

$\{0.34 \leq x2 \leq 1.0;$
$-0.84x2+0.97 \leq y2 \leq -0.85x2+1.03\}$ for $Al_{x2}In_{1-x2}As_{y2}Sb_{1-y2}$;

$\{0.07 \leq x3 \leq 1.0;$
$-0.57x3+0.67 \leq y3 \leq -0.58x3+0.72\}$ for $Al_{x3}In_{1-x3}P_{y3}Sb_{1-y3}$; and $\{0.13 \leq x4 \leq 1.0;\ 0.06x4+0.04 \leq y4 \leq 0.06x+4+0.08\}$ for $Al_{x4}Ga_{1-x4}P_{y4}Sb_{1-y4}$.

Among these four kinds of compound semiconductors, AlGaAsSb and AlInAsSb are particularly preferable. This is because the control of the composition thereof is easy, and a high-quality thin film can easily be obtained. In particular, when AlGaAsSb is used as the first compound semiconductor layer 2, the resulting FET exhibited the optimum characteristics.

The first compound semiconductor layer 2 sometimes has conductivity even when it is not doped with any impurity. In such a case, the layer is sometimes doped with impurities having a polarity opposite to that of carriers which contribute to the electric conduction in order to cancel the effect of the carriers. The thickness of the first compound semiconductor layer 2 may arbitrarily be selected, but preferably ranges from 0.05 to 3.0 μm due to the limitation in the production thereof. It more preferably ranges from 0.1 to 2.0 μm and most preferably 0.1 to 1.0 μm.

InAs Layer 3

The InAs layer 3 functioning as the channel layer in the present invention preferably has a thickness equal to or less than 0.2 μm because of the convenience of control of the electric conduction thereof by an electric voltage applied to a control electrode. The InAs layer 3 may be a non-doped one, but it may optionally be doped with impurities since it exhibits a sufficiently high electron mobility even when it is doped with impurities. Donor impurities as dopants may be any atom so far as it serves as a donor atom in InAs, but particularly preferred dopants are Si, S, Sn, Se and Te. The concentration of the impurities to be doped ranges in general from $5 \times 10^{16}/cm^3$ to $5 \times 10^{18}/cm^3$, preferably from $1 \times 10^{17}/cm^3$ to $1 \times 10^{18}/cm^3$, and more preferably from $2 \times 10^{17}/cm^3$ to $8 \times 10^{17} cm^3$. These impurities may be doped uniformly in the direction of thickness of the InAs layer 3. Doping impurities only in the central portion of the film and not doping them in portions of the layer adjacent to the interfaces between the InAs layer 3 and the other compound semiconductor layers 2 and 4 is preferable because this is effective to reduce the scattering of conduction electrons at the interface between the first compound semiconductor layer 2 and the second compound semiconductor layer 4. Moreover, up to 9% of In atoms in the InAs layer can be replaced with Ga atoms. The replacement within this range will maintain the difference between the lattice constant of the layer 2 and that of InAs in the InAs layer 3 equal to or less than 0.6% thus ensuring substantial lattice matching with the first and second compound semiconductor layers 2 and 4. For this reason, the breakdown voltage of the resulting FET can be improved without greatly impairing the characteristics of InAs. In addition, when the lattice constants of the first and second compound semiconductor layers 2 and 4 differ from that of InAs in the InAs layer 3 by less than or equal to 0.4%, the deterioration of the characteristics of the InAs layer 3 due to the lattice mismatching, or any change with time can be reduced as long as the amount of Ga to be replaced with In is limited to up to 6%. Further, when the degree of lattice mismatching is controlled up to 0.2% in order to ensure a higher degree of lattice matching, and when the amount of Ga atoms to be replaced with In atoms is adjusted to be equal to or less than 3%, the deterioration of the characteristics of the InAs layer 3 due to the lattice mismatching can be further reduced.

Second Compound Semiconductor Layer 4

It is preferable that the second compound semiconductor layer 4 formed on the top of the InAs layer 3 substantially establishes the lattice matching with InAs, and has a bandgap greater than that of the InAs layer 3 so as to form, at the interface between the second compound semiconductor layer 4 and the InAs layer 3, a barrier suitable for confining conduction electrons within the InAs layer 3. Moreover, the electron affinity of the second compound semiconductor layer 4 is preferably smaller than that of the InAs layer 3, and the sum of the electron affinity and the bandgap of the second layer 4 is preferably greater than the sum of the electron affinity and the bandgap of the InAs layer because this will prevent the characteristics of the InAs layer 3 from being impaired. These requirement are common to the foregoing requirements for the first compound semiconductor layer 3.

In FETs employing a Schottky junction, it is further required that the second compound semiconductor layer 4 and a gate electrode 6 form a good Schottky junction. On the other hand, in MIS type FETs using the second compound semiconductor layer 4 as an insulating barrier layer, the second compound semiconductor layer 4 is preferably made from a material which can form a good insulating film. The second compound semiconductor layer 4 may be made from any compound semiconductor which satisfies these requirements. Among these, particularly preferred are $Al_{x1}Ga_{1-x1}As_{y1}Sb_{1-y1}$, $Al_{x2}In_{1-x2}As_{y2}Sb_{1-y2}$, $Al_{x3}In_{1-x3}P_{y3}Sb_{1-y3}$ and $Al_{x4}Ga_{1-x4}P_{y4}Sb_{1-y4}$ which are used for forming the first compound semiconductor layer 2. Moreover, the compositional ratios thereof can be determined as those of the first compound semiconductor layer 2. In particular, AlGaAsSb and AlInAsSb are preferred because high-quality thin films can easily be prepared. The thickness of the second compound semiconductor layer 4 suitably ranges from 50 to 1,000 Å. More specifically, the thickness thereof should fall within such a range as no conduction electron is present in the second compound semiconductor layer 4 after the formation of gate electrode 6.

When the second compound semiconductor layer 4 is doped with donor impurities so as to be used as an electron donor layer for the InAs layer 3, the impurities to be doped may be any atom which serves as a donor atom, but particularly preferred donor impurities are Te, Se, S, Si and Sn. The amount of the impurities to be doped in general ranges from $5 \times 10^{16} cm^3$ to $5 \times 10^{18}/cm^3$, and preferably from $1 \times 10^{17}/cm^3$ to $5 \times 10^{18}/cm^3$. The doping may be performed uniformly in the direction of thickness of the second layer 4, or may have a particular profile. In particular, it is preferred that the doping be performed to the second compound semiconductor layer 4 except for the region near the interface on which the gate electrode 6 is formed because this will prevent the gate breakdown voltage from reducing. Moreover, it is also preferred that the doping be performed to the second compound semiconductor layer 4 except for the region near the interface with the InAs layer 3 because this will reduce the scattering of conduction electrons in the InAs layer 3 due to the presence of the impurities, and improve the operating speed of the resulting FET.

The second compound semiconductor layer 4 may be produced from compound semiconductors comprising Group II and VI elements as well as from those comprising Group III and V elements.

It is preferable to form the first and second compound semiconductor layers 2 and 4 from the same compound semiconductor having the same composition from the viewpoint of simplification of the production processes, but these layers may be obtained by combining the compound semiconductors having different composition, or the same composition with different compositional ratios. The combination of these layers 2 and 4 is properly selected as needed.

Source Electrode 5 and Drain Electrode 7

Source electrode 5 and drain electrode 7 must form ohmic junctions with the InAs layer 3 positioned beneath these electrodes. The ohmic junction may have a variety of structures. In the embodiment shown in FIG. 3, for instance, these electrodes directly make contact with the InAs layer 3.

The InAs layer 3 has a narrow bandgap, and therefore, an ohmic junction having a low contact resistance can easily be obtained simply by bringing the electrode into close contact with the InAs layer 3. To this end, the ohmic electrodes 5 and 7 can directly be formed on the InAs layer 3 by partially etching the second compound semiconductor layer 4 to remove portions of the layer corresponding to these electrodes 5 and 7, and then forming these electrodes which make close contact with the InAs layer 3. In this case, an alloying process may be employed in order to reduce the contact resistance between the electrodes 5 and 7 and the InAs layer 3, but good ohmic junctions can be obtained by simply vapor-depositing electrode materials on the desired positions of the inAs layer 3. Accordingly, these metal electrodes may have any well-known stacked structures such as three-layer stacked electrode structures like AuGe/Ni/Au, or monolayered metal structures of, for instance, Al, Ti, Au and W. Thus, the metal electrodes may have structures comprising a variety of combinations of metals.

Gate Electrode 6

Gate electrode 6 shown in FIG. 3 may have any structure so far as it can form a depletion layer under the electrode. For instance, a structure can be employed such as a Schottky junction, an MIS (METAL-INSULATOR-SEMICONDUCTOR) structure in which an insulating material is sandwiched between the gate electrode 6 and the InAs layer 3, and a pn-junction. In particular, such materials as Al, Ti, W, Pt, WSi, Au, which are capable of forming a Schottky junction with the semiconductor used for forming the second compound semiconductor layer 4 or the like, are preferable. The stacked structures of these metals are also preferred.

The basic layer structure of the FET according to the present invention has been discussed above in detail. Since, the electron mobility of the InAs layer 3 does not reduce so much even if the layer is doped with impurities, and maintains higher values than those of GaAs, InGaAs or the like, three types of transistors having different properties can be produced by properly selecting the combination of dopants used in the InAs layer 3 and the second compound semiconductor layer 4. These transistors will be explained below as Variations 1 to 3 of the foregoing embodiment.

Variation 1

Figure 8A:
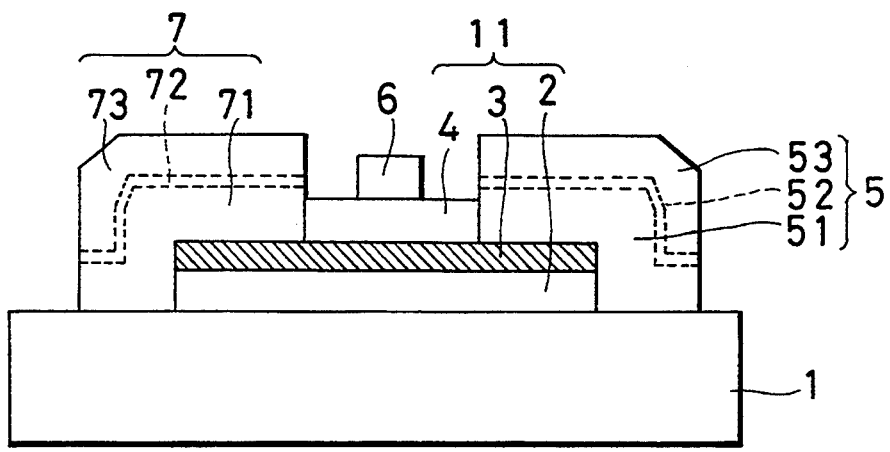
FIGS. 8A to 8C are cross sectional views of structures of three variations of the FET according to the invention, which differ in regions doped with donor impurities from one another.

In the first variation, as shown in FIG. 8A, the second compound semiconductor layer 4 is not doped with donor impurities and used as an insulating barrier layer. A Trial Production Example 1 describes below belongs to this Variation 1.

In this case, the InAs layer 3 must not be doped with donor impurities, but may be doped with donor impurities to such an extent as the characteristic properties of the InAs layer 3 are not impaired. In this FET, the gate electrode 6 is formed on the second compound semiconductor layer 4 having a low impurity concentration. Therefore, the resulting gate electrode has a high gate breakdown voltage and a good rectifying characteristic.

Variation 2

Figure 8B:
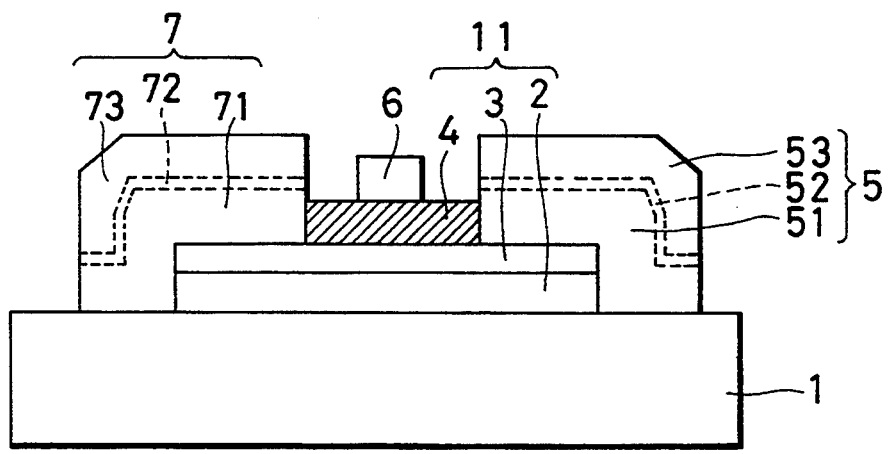

In this second variation, as shown in FIG. 8B, only the second compound semiconductor layer 4 is doped with donor impurities, and a Trial Production Example 2 belongs to this Variation 2. The conduction electrons in the InAs layer 3 are mainly supplied from the second compound semiconductor layer 4 due to the difference in the electron affinity therebetween, and the InAs layer 3 is not intentionally doped with impurities. For this reason, among these three types of FETs, this second type has the lowest scattering of the conduction electrons due to the impurities present in the InAs layer 3. Therefore, this second variation is best in high speed operation and noise characteristics, among the InAs-FETs according to the present invention.

Variation 3

Figure 8C:
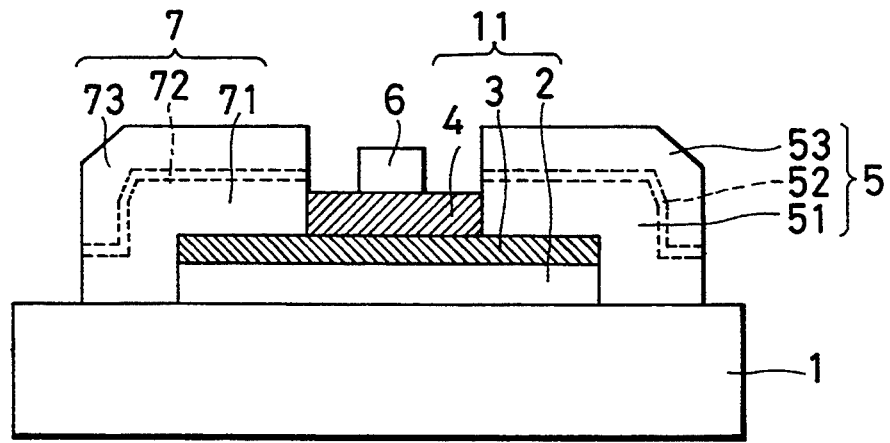

As seen from FIG. 8C, the third variation comprises the InAs layer 3 and the second compound semiconductor layer 4 which are both doped with donor impurities, and a Trial Production Example 3 belongs to this Variation 3. In this case, there are present in the InAs layer 3 conduction electrons derived from the donor impurities in the InAs layer 3 and supplied from the second compound semiconductor layer 4 due to the difference in the electron affinity between the compound semiconductor layer 4 and the InAs layer 3, which conduction electrons serve as current carriers. Thus, it is possible to concentrate conduction electrons in the InAs layer 3 with a very high concentration by doping the InAs layer 3 with such an amount of impurities which does not impair the characteristics of the InAs layer 3. As a result, even if the thickness of the InAs layer 3 is very thin, a large amount of current can pass therethrough. Thus, an ideal structure for the channel layer of FETs can be obtained.

Further, although the amount of the intrinsic conduction electrons thermally excited in the InAs layer 3 ranges from $10^{15}/cm^3$ to $10^{16}/cm^3$ near the room temperature, that of the conduction electrons originated from the donor impurities is high on the order of $10^{17}/cm^3$ to $10^{18}/cm^3$. For this reason, an FET can be obtained having stable characteristics against the temperature change in an operating environment.

Variation 4

Figure 9:
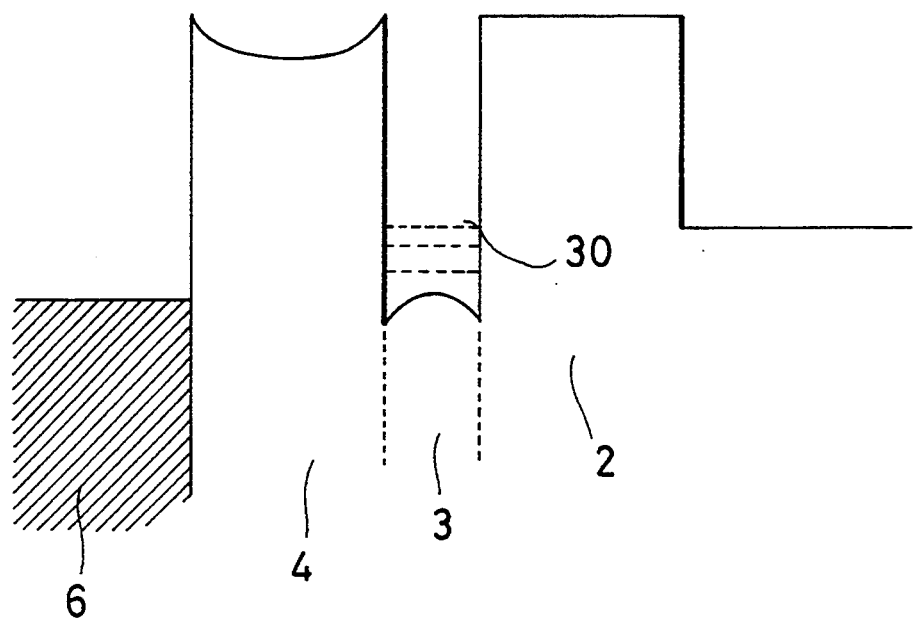
FIG. 9 is a diagram showing the quantum levels formed in the channel layer of an FET as a Variation 4 of the foregoing embodiment.

If the thickness of the InAs layer 3 reaches such a value as the quantum levels are formed, the energy level 30 of the conduction electrons in the InAs layer 3 is quantized to form so called quantum levels as shown in FIG. 9, irrespective of the impurity doping manner to the second compound semiconductor layer 4 and the InAs layer 3. As a result, even if the temperature of the operating environment for the device varies, the resistance of the InAs layer 3 fluctuates only slightly, and hence, FETs can be obtained having temperature characteristics superior to those which do not form any quantum level.

Moreover, since the conduction electrons which pass thorough the InAs layer 3 hardly cause scattering, the transistors of this type are suitable for a high speed operation. In addition, although the InAs layer 3 of a narrow bandgap is used as the channel layer, the discrete quantum levels provide the same effect as that when the bandgap is substantially extended. Thus, the breakdown voltage of the transistor can be increased.

In order to obtain these characteristics, it is preferable to limit the film thickness of the InAs layer 3 to equal to or less than 400 Å. In particular, the thickness of 200 Å or less provides conspicuous effect based on the quantum levels.

InAs as a material for quantum wells has an effective mass of electron smaller than those of GaAs and Si. Therefore, quantum levels are readily formed even if the quantum well is wide. The lattice constants of compound semiconductors are in general in the order of 5 to 6 Å, and a difference in level in the order of approximately a monoatomic layer is sometimes formed on the surface during the growth of a thin film. However, the difference in level has a small effect since the thickness of the quantum well is great. Furthermore, since InAs can provide a wide quantum well, a large conductance can be obtained when employing a quantum well as the channel layer. A Trial Production Example 4 belongs to this Variation 4, and is an example of the quantum effect FET in which the thickness of the InAs layer 3 is set at 100 Å.

Next, variations of the source electrode 5 and the drain electrode 7 will be explained below.

Variation 5

Figure 10:
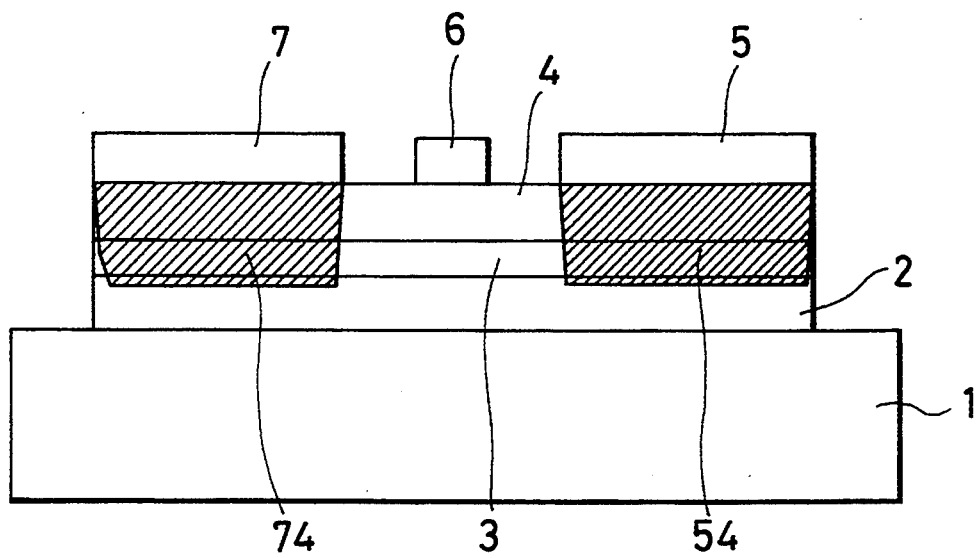
FIG. 10 is a cross sectional view showing the structure of an FET as a Variation 5 of the foregoing embodiment in which the InAs layer is connected to source and drain electrodes by the ohmic junctions through the second compound semiconductor layer.

As shown in FIG. 10, the source electrode 5 and drain electrode 7 may have a structure in which these electrodes form ohmic junctions with the InAs layer 3 through the second compound semiconductor layer 4 formed on the InAs layer 3. This structure is formed according to the following method. The ohmic junctions between electrodes 5 and 7 and the InAs layer 3 are formed by carrying out an alloy annealing to diffuse the electrode material and to thus form regions 54 and 74 in which impurities are doped in high concentrations. Alternatively, donor impurities are ion-implanted only in regions 54 and 74 under electrodes 5 and 7 to reduce the contact resistance.

Variation 6

Figure 11:
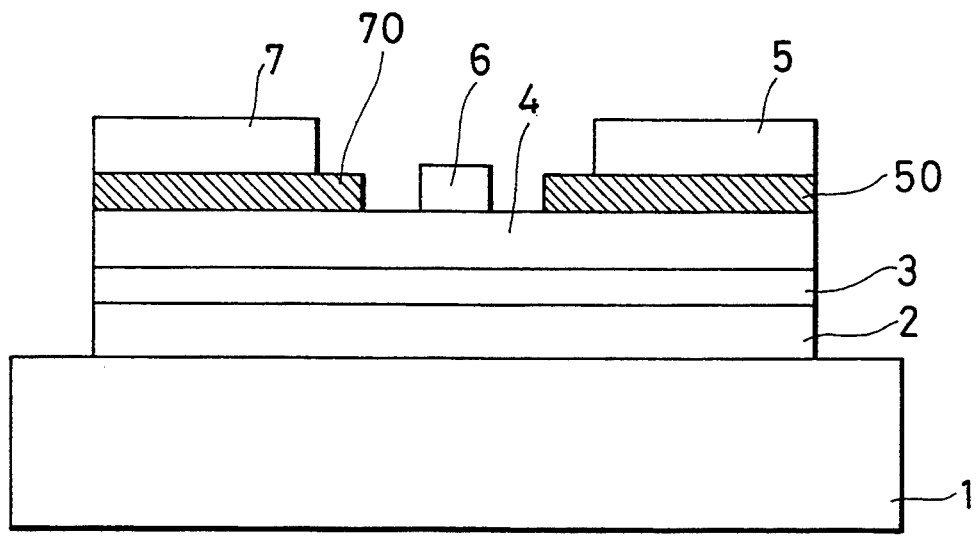
FIG. 11 is a cross sectional view showing the structure of an FET as a Variation 6 of the foregoing embodiment in which contact layers are disposed beneath the source and drain electrodes.

As shown in FIG. 11, contact layers 50 and 70 may be formed in order to form ohmic junctions having a lower contact resistance between the source and drain electrodes 5 and 7 and the InAs layer 3.

Contact layers 50 and 70 are preferably formed from, for instance, GaAs, GaAsSb, InGaAs or InSb doped with donor impurities. The thickness thereof may be equal to or less than 500 Å, and is particularly preferable from 100 to 300 Å. The donor impurities to be doped into the contact layers 50 and 70 may be any substance which serves as donor atoms in the contact layers, and particularly preferred atoms are, for instance, Si, S, Sn, Se and Te. Although the doped amount of these impurities varies depending on the material of the contact layers 50 and 70, it preferably ranges from $5 \times 10^{17}/cm^3$ to $5 \times 10^{19}/cm^3$.

Variations of the gate electrode 6 will be explained below.

Variation 7

Figure 12:
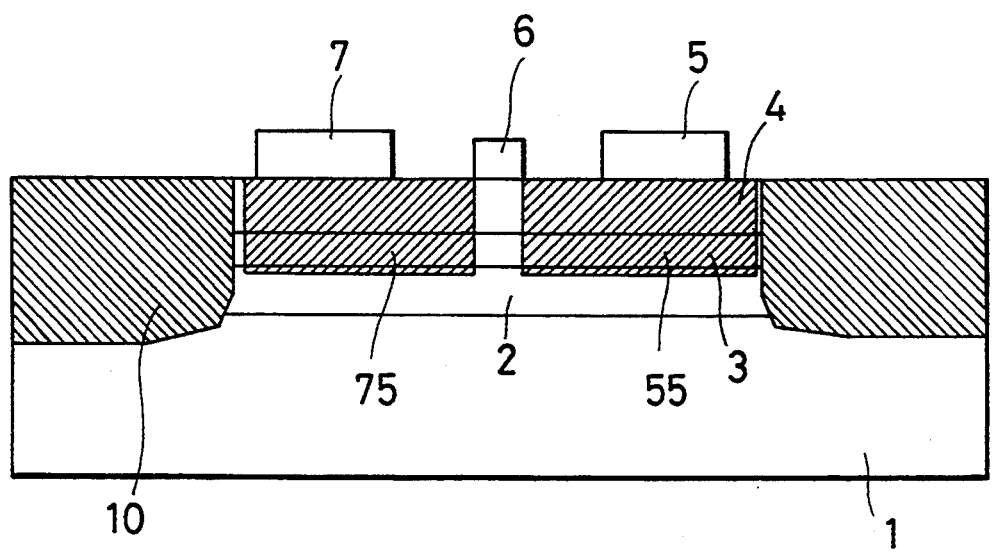
FIG. 12 is a cross sectional view showing the structure of an FET as a Variation 7 of the foregoing embodiment in which donor impurities are ion-implanted into the peripheral region of the gate electrode (except for the area below the gate electrode) using the gate electrode as a mask.

When a refractory metal such as W or WSi is used as a material for the gate electrode 6, the device may have a self-alignment structure. This structure is formed, as shown in FIG. 12, by ion-implanting donor impurities into regions 55 and 75 of the semiconductor layers 4 and 3 except for the area under the gate electrode 6 so that the resistances of the regions 55 and 75 around the gate electrode 6 are reduced. According to this structure, parasitic capacitances between the source electrode 5 and the gate electrode 6, or between the gate electrode 6 and the drain electrode 7 can be reduced. Further, the variation in the parasitic resistance can be restricted to a very low level.

Impurities to be ion-implanted may be any substance which serves as donor impurities for both second compound semiconductor layer 4 and InAs layer 3. Particularly preferred are, for instance, S, Se, Sn and Si. The concentration of the impurities to be implanted preferably ranges from $3 \times 10^{17}/cm^3$ to $1 \times 10^{19}/cm^3$.

As seen from FIG. 3, the gate electrode 6 may be formed directly on the second compound semiconductor layer 4, but may likewise be formed on another layer directly formed on the second compound semiconductor layer 4. Variation 8

Figure 13:
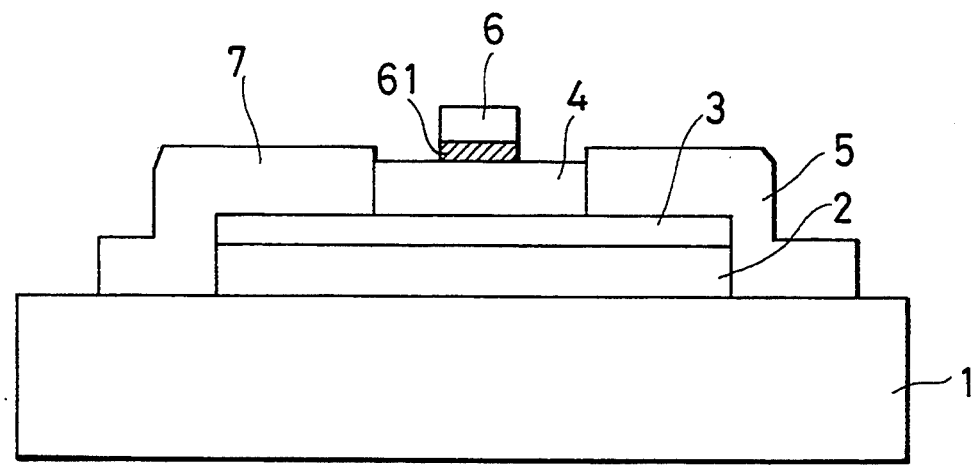
FIG. 13 is a cross sectional view showing the structure of an FET as a Variation 8 of the foregoing embodiment in which a conductive layer is inserted between the second compound semiconductor layer and the gate electrode.

As shown in FIG. 13, after the formation of the second compound semiconductor layer 4, a conductive layer 61 under the gate electrode comprising a semiconductor of a narrow bandgap such as InAs or InSb is formed beneath the gate electrode 6 under an air shielded condition. In this structure, since no oxide film is present at the interface between the conductive layer 61 under the gate electrode and the second compound semiconductor layer 4, an ideal interface having only a few interface states can be obtained. On the other hand, since the gate electrode 6 and the conductive layer 61 under the gate electrode forms an ohmic junction, the barrier formed between the second compound semiconductor layer 4 and the conductive layer 61 under the gate electrode may provide the same effect as achieved by connecting the gate electrode 6 to the second compound semiconductor layer 4 through a Schottky junction.

Variation 9

Figure 14:
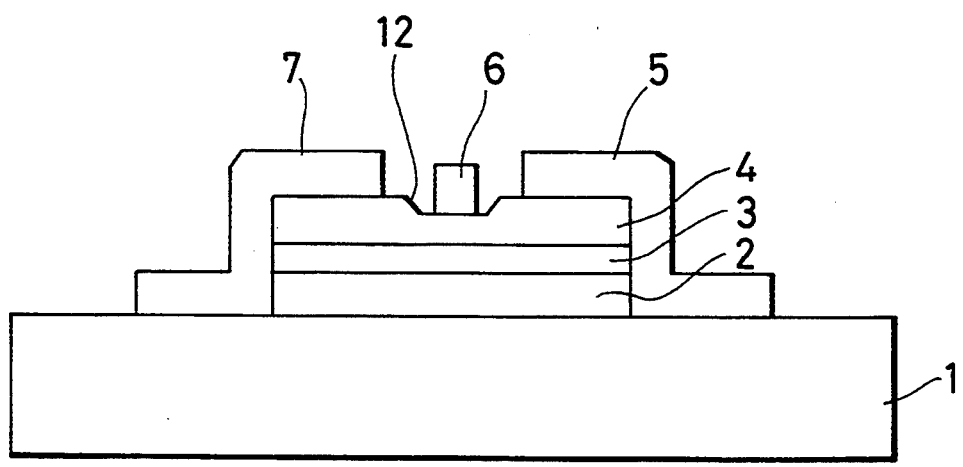
FIG. 14 is a cross sectional view showing the structure of an FET as a Variation 9 of the foregoing embodiment in which the gate electrode has a recessed structure.

As shown in FIG. 14, the breakdown voltage of the FET can be increased by forming a recess structure 12 at a portion on the second compound semiconductor layer 4, where the second compound semiconductor layer 4 is joined to the gate electrode 6. When the gate electrode is disposed on a layer other than the second compound semiconductor layer 4, the recess structure 12 can be formed on that layer instead of forming on the second compound semiconductor layer 4.

The following description relates to variations which are provided with insert layers and/or a protective film.

Variation 10

Figure 15A:
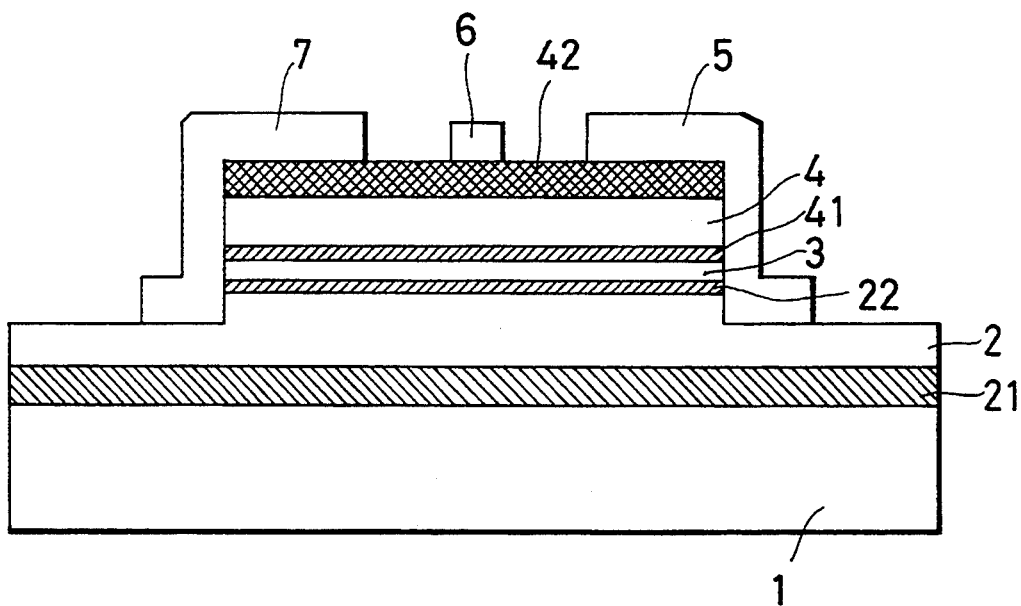
FIGS. 15A and 15B are cross sectional views showing the structures of FETs comprising a variety of spacer layers which are incorporated into the foregoing embodiment.

The FETs according to the present invention can accomplish a high-quality InAs layer 3 with a simple structure wherein the first compound semiconductor layer 2 is directly deposited on the substrate 1, and the InAs layer 3 is formed on the compound semiconductor layer 2. However, the FETs according to the present invention may further comprise insert layers positioned between the foregoing layers for improving the properties of the FETs. Referring now to FIG. 15A, each insert layer will be detailed below.

The FET shown in this figure comprises a first semiconductor insert layer 21 made from a material different from that of the substrate 1 and positioned on the substrate 1, a second semiconductor insert layer 22 positioned between the first compound semiconductor layer 2 and the InAs layer 3, and a third semiconductor insert layer 41 positioned between the InAs layer 3 and the second semiconductor layer 4. These insert layers serve to reduce the hole current and to improve the conductance of the resulting transistor.

The second and third semiconductor insert layers 22 and 41 are arranged such that they are in contact with the InAs layer 3 serving as the channel layer in order to effectively confine the conduction electrons within the InAs layer 3. For this reason, materials thereof are selected from semiconductors having bandgaps wider than that of InAs. Further, it is preferable that the semiconductors used for forming semiconductor insert layers 22 and 41 satisfy such conditions that the electron affinity thereof is smaller than that of the InAs layer 3, and the sum of the electron affinity and the bandgap of that semiconductor is greater than that of InAs layer 3. Among these, particularly preferred are AlSb, AlGaSb and InAlAs.

Each inserted semiconductor layer 21, 22 or 41 has a lattice constant different from that of the InAs layer 3, and therefore, dislocation due to the lattice mismatching takes place therebetween if the thickness of each of these semiconductor layers exceeds a specific value. As a result, properties of the InAs layer 3 can sometimes deteriorate. Therefore, these semiconductor insert layers 21, 22 and 41 preferably have thicknesses which do not cause such dislocation due to the lattice mismatching. In other words, their thicknesses should be within a critical film thickness. The critical film thickness varies depending on semiconductor materials for the insert layers. For instance, it is about 160 Å for AlSb when it is used in combination with the InAs layer 3.

Figure 15B:
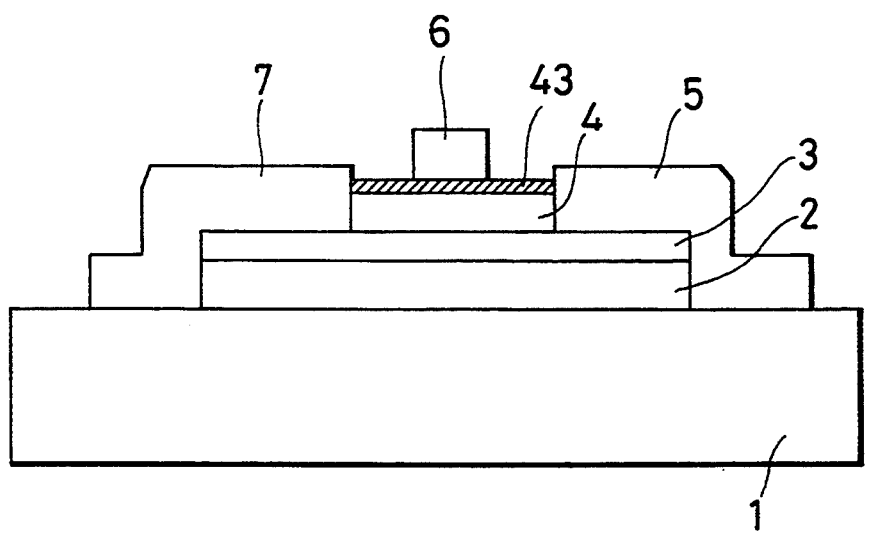

Alternatively, an insulating layer 43 may be formed in contact with the bottom of the gate electrode 6, as shown in FIG. 15B.

Variation 11

Semiconductors used for forming the first and second compound semiconductor layers 2 and 4 in the present invention are oxidized easier than other semiconductors such as GaAs and InAs. In order to reduce changes in properties of the FETs with time due to the oxidation of these compound semiconductors, a layer for preventing oxidation is preferably applied in addition to passivation layers used in the common semiconductor devices.

A fourth semiconductor insert layer 42 formed on the second compound semiconductor layer 4 as shown in FIG. 15A protects the layer 4 from contacting air, and thus preventing deterioration of properties due to oxidation. The fourth semiconductor insert layer 42 may be formed from any semiconductor which is hardly oxidized, but particularly preferred materials are, for instance, GaAs, GaSb and GaAsSb. The thickness thereof suitably ranges from 50 to 1,000 Å. In particular, the optimum thickness thereof ranges from 100 to 700 Å.

Variation 12

In the FET, the source-drain current is controlled by an electric voltage applied to the gate electrode 6. This requires the InAs layer 3 to be separated into an electrically inactive region and an active region 11 serving as the channel layer of the FET. The separation may be performed by a method for forming a mesa structure, or by a method in which the region other than the active region 11 is made nonconductive.

In the method for forming a mesa structure, the active region 11 is formed by etching the InAs layer 3 with liquid mainly Comprising an alkali or acid, or with gas.

On the other hand, the method for making nonconductive the second compound semiconductor layer 4 and the InAs layer 3 is performed using a usual method such as ion-implantation, irradiation with an electron beam or the like. This structure in which undesired portions are made nonconductive does not have any section unlike the mesa structure, and therefore, problems of, for instance, gate leakage or oxidation hardly arise.

The mesa structure, i.e., a trapezoid structure remaining after the removal of undesired portions often suffers from the following drawbacks. The planes of the first and second compound semiconductor layers 2 and 4 which are exposed to air undergo oxidation. This sometimes leads to deterioration of properties of the transistor. Moreover, the portions of the InAs layer 3 exposed to air at the sections of the mesa structure form an ohmic junction only when it comes in contact with gate electrode 6. As a result, a leakage current is sometimes generated between the gate electrode 6 and the InAs layer 3.

Figure 16A:
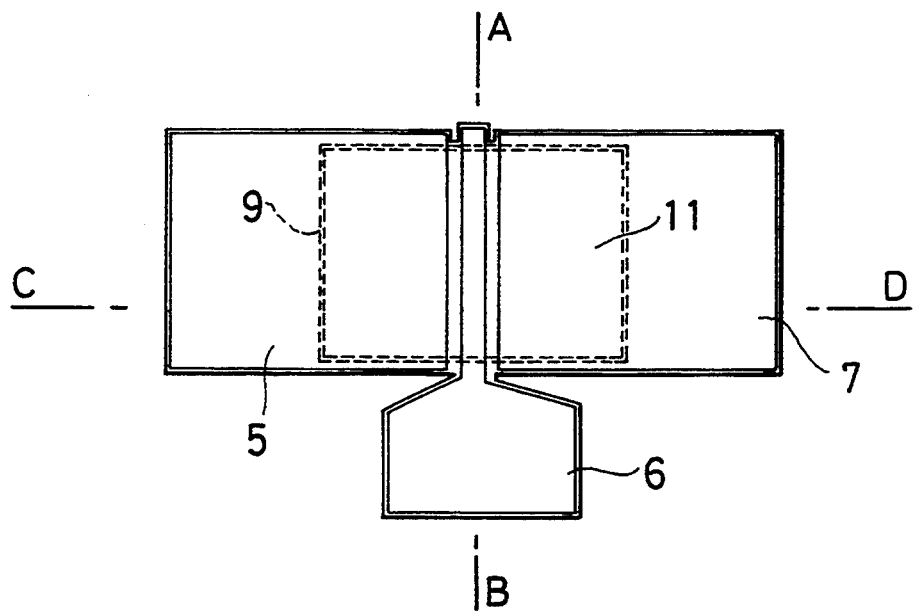
FIGS. 16A to 16C are diagrams showing the structure of an FET as a Variation 12 of the foregoing embodiment in which the device is separated by the mesa etching and insulating side walls are formed on the sides of the mesa cross section.
Figure 16B:
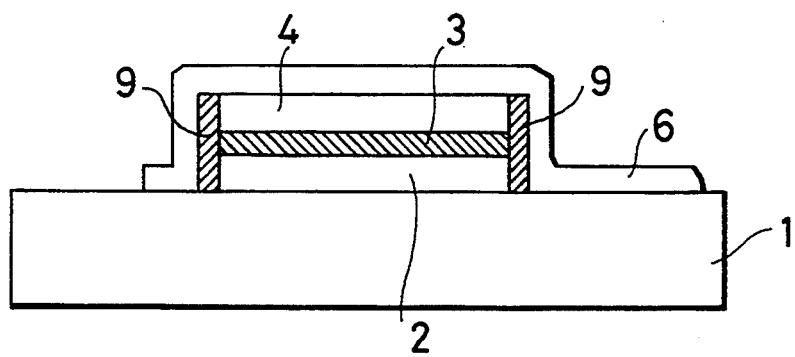

Side walls 9 shown in FIG. 16B are provided to eliminate such drawbacks. The side walls 9 are made from an insulating or semi-insulating material and are formed in such a manner that the InAs layer 3 does not come into direct contact with the gate electrode 6. Thus, the occurrence of any leakage current form the gate electrode 6 to the InAs layer 3 can be eliminated. Moreover, since the sections of the mesa structure are covered, oxidation of the first and second compound semiconductor layers 2 and 4 can be prevented.

Figure 16C:
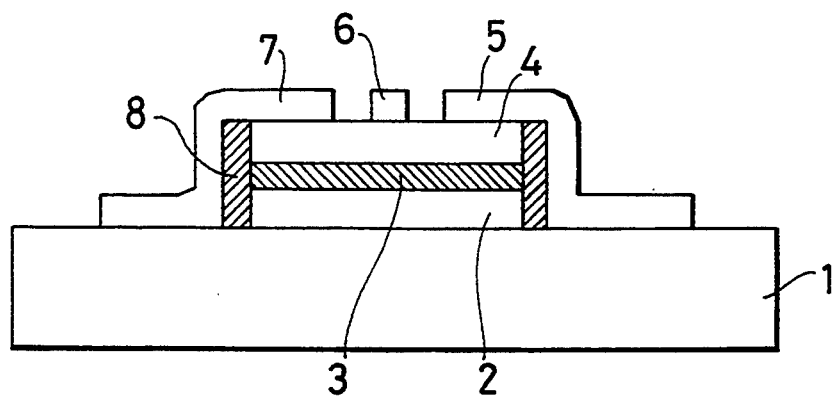

FIG. 16A is a plan view of the FET, FIG. 16B is a cross sectional view taken along the line A–B depicted in FIG. 16A and FIG. 16C is a cross sectional view taken along the line C–D shown in FIG. 16A. In these figures, side walls 9 are formed so that the sectional planes of the mesa structure are covered, and thus, the InAs layer 3 and the gate electrode 6 are separated from one another.

The material for the side walls 9 is suitably selected from insulating semiconductors such as $SiN_x$, $SiO_2$, $SiO_xN_y$ and $Al_2O_3$ which are usually used as a protective film for semiconductors. Among these, $SiN_x$ and $SiO_xN_y$ are particularly preferable.

Variation 13

Figure 17:
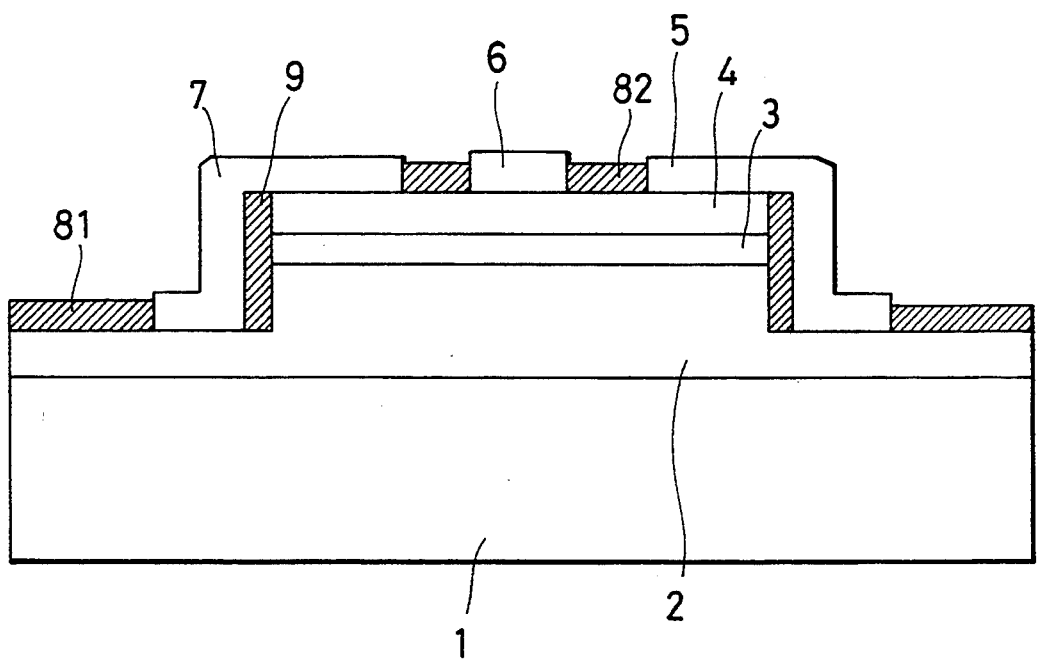
FIG. 17 is a cross sectional view showing the structure of an FET as a Variation 13 of the foregoing embodiment in which an oxidation-guard layer is supplemented to the structure of the foregoing embodiment.

FIG. 17 shows an embodiment in which a first protective film 81 and a second protective film 82 are formed on the surface of this FET in order to reduce the deterioration of properties of the device due to oxidation of the first and second compound semiconductor layers. The first protective film 81 was formed on the portion of the top surface of the first compound semiconductor layer 2, on which the active region 11 is not formed, using an insulator such as $SiN_x$, $SiO_2$, or $Al_2O_3$. In addition, the second protective film 82 was formed on the top surface of the second compound semiconductor layer 4 in the active region 11, or on the top surface of the fourth semiconductor insert layer 42 except for electrodes 5, 6 and 7. The first protective film 81 and the second protective film 82 may be provided as a sheet of film or may be formed separately. Alternatively, the first protective film 81, the second protective film 82 and the side walls 9 may be formed by removing unnecessary portions of a single insulating film by anistotropic etching using reactive ion etching. This presents an advantage that the process become more simple.

Other Generally Applied Structures

A large number of the FETs according to the present invention can be integrated on a single substrate. Moreover, the FETs of the invention may be formed on a single substrate together with transistors whose substrate and channel layer are made from the same semiconductor material. In particular, the structures are preferable in which the InAs-FETs according to the present invention characterized by high speed operation are integrated with GaAs-FETs formed on a single substrate.

[Trial Product ion Example 1]

This example is given for explaining the production of the FET shown in FIG. 8A, in which the second compound semiconductor layer 4 serves as the insulating barrier layer.

A 350 μm thick semi-insulating GaAs substrate having a mirror polished plane (100) was used as the substrate 1. First, there were formed the following layers in this order on the substrate 1 using the molecular beam epitaxy technique: An 8,000 Å thick non-doped layer of $Al_{0.8}Ga_{0.2}As_{0.14}Sb_{0.86}$, which was in the lattice matching with InAs, and which serves as the first compound semiconductor layer 2; a 700 Å thick InAs layer 3 which was doped with a donor impurity Si at a concentration of $2\times 10^{17}/cm^3$; and a nondoped 400 Å thick layer of $Al_{0.8}Ga_{0.2}As_{0.14}Sb_{0.86}$ as the second compound semiconductor layer 4. Then unnecessary portions of the stacked thin films formed on the GaAs substrate 1 were removed by the photolighography technique so that a resist pattern is formed for producing a channel portion for the device. Thereafter, the assembly was etched with an $H_2SO_4{:}H_2O$ system etchant to form the active region 11 having a mesa structure. Then, after a resist pattern was formed, only portions of the AlGaAsSb layer 4 under the source electrode 5 and the drain electrode 7 were etched with an $NH_4OH{:}H_2O_2$ system etchant so as to expose the surface of the InAs layer 3. Subsequently, 2,000 Å thick AuGe (Au:Ge=88:12) layers 51 and 71, 500 Å thick Ni layers 52 and 72, and 3,500 Å thick Au layers 53 and 73 were continuously deposited using the vacuum evaporation technique. Then, the patterns of the source electrode 5 and the drain electrode 7 comprising three layers 51, 52 and 53, and 71, 72 and 73 were formed by the lift-off technique to obtain ohmic junctions between these electrodes and the InAs layer 3. Further, a resist pattern for the gate electrode 6 was formed, and then the gate electrode 6 was formed by evaporating a 3,000 Å thick Al layer on the entire surface of the wafer, followed by a lift-off process. After that, the wafer was cut into discrete devices by dicing. Thus, the FET according to the present invention as shown in FIG. 8A was fabricated. Subsequently, this device is provided with leads, and packaged through the usual process.

[Trial Production Example 2]

This example is given for explaining the production of the FET shown in FIG. 8B, in which the second compound semiconductor layer 4 is doped with donor impurities and serves as the electron donor layer to the InAs 3, wherein the InAs layer 3 is not doped intentionally with any impurity.

A 350 μm thick semi-insulating GaAs substrate 1 having a mirror polished plane (100) was used as the substrate 1, and the following layers are sequentially formed on the substrate by the molecular beam epitaxy technique: an 8,000 Å thick non-doped layer of $Al_{0.8}Ga_{0.2}As_{0.14}Sb_{0.86}$, which was in the lattice matching with InAs, and which serves as the first compound semiconductor layer 2; a 700 Å thick InAs layer 3 which was not doped with any donor impurity; and a 400 Å thick layer of $Al_{0.8}Ga_{0.2}As_{0.14}Sb_{0.86}$ as the second compound semiconductor layer 4, which was doped with Se to a concentration of $2\times 10^{18}/cm^3$. After the same procedures used in Trial production Example 1 were repeated to obtain the FET as shown in FIG. 8B.

[Trial Production Example 3]

This example is given for explaining the production of the FET shown in FIG. 8, in which both second compound semiconductor layer 4 and InAs layer 3 are doped with donor impurities. The conduction electrons present in the InAs layer 3 are composed of electrons supplied from the second compound semiconductor layer 4 and those originated from the donor impurities present in the InAs layer 3.

A 350 μm thick semi-insulating GaAs substrate 1 having a mirror polished plane (100), was used as substrate 1, and the following layers are sequentially formed on the substrate by the molecular beam epitaxy technique: an 8,000 Å thick non-doped layer of $Al_{0.8}Ga_{0.2}As_{0.14}Sb_{0.86}$, which was in the lattice matching with InAs, and which serves as the first compound semiconductor layer 2; a 700 Å thick InAs layer 3 which was doped with Se as donor impurities to a concentration of $5\times 10^{17}/cm^3$; and a 400 Å thick layer of $Al_{0.8}Ga_{0.2}As_{0.14}Sb_{0.86}$, as the second compound semiconductor layer 4, which was doped with Se to a concentration of $5\times 10^{17}/cm^3$. After that, the same procedures used in Trial production Example 1 were repeated to obtain the FET as shown in FIG. 8C.

Trial Production Example 4]

This example is given for explaining the production of the quantum effect type FET, which includes the 100 Å thick InAs layer 3 containing quantum levels formed therein in the FET as shown in FIG. 3. The InAs layer 3 is doped with Si as donor impurities.

A 350 μm thick semi-insulating GaAs substrate having a mirror polished plane (100) was used as the substrate 1, and the following layers are sequentially formed on the substrate by using the molecular beam epitaxy technique: an 8,000 Å thick non-doped layer of $Al_{0.8}Ga_{0.2}As_{0.14}Sb_{0.86}$, which was in the lattice matching with InAs, and which serves as the first compound semiconductor layer 2; a 100 Å thick InAs layer 3 which was doped with Si as donor impurities to a concentration of $2 \times 10^{17}/cm^3$; and a 400 Å thick non-doped layer of $Al_{0.8}Ga_{0.2}As_{0.14}Sb_{0.86}$ serving as the second compound semiconductor layer 4. After that, the same procedures used in Trial production Examples 1 to 3 were repeated to give a quantum effect type FET as shown in FIG. 9.

[Trial Production Example 5]

Figure 18:
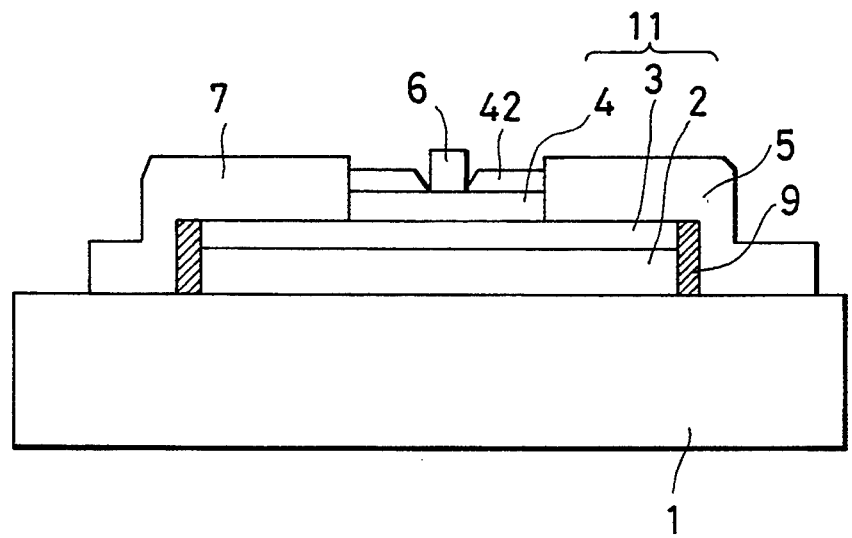
FIG. 18 is a cross sectional view showing the structure of the FET prepared in Trial Production Example 5.

This example is given for explaining the production of the FET having the structure as shown in FIG. 18. In this Trial Production Example, the second compound semiconductor layer 4 is doped with donor impurities and serves as an electron donor layer to the InAs layer 3 which is not doped with any impurity. In addition, a GaAsSb layer is formed as the fourth semiconductor insert layer 42.

On a 350 μm thick semi-insulating GaAs substrate 1 having a mirror polished plane (100), the following layers are sequentially formed using the molecular beam epitaxy technique: an 8,000 Å thick non-doped layer of $Al_{0.7}Ga_{0.3}As_{0.15}Sb_{0.85}$, which was in the lattice matching with InAs, and serves as the first compound semiconductor layer 2; a 200 Å thick InAs layer 3 which was not doped with any donor impurity; and a 500 Å thick layer of $Al_{0.7}Ga_{0.3}As_{0.15}Sb_{0.85}$ which was doped with donor impurities Se and serves as the second compound semiconductor layer 4. Finally, a 200 Å thick $GaAs_{0.15}Sb_{0.85}$ layer which was not doped with any impurity was formed as the fourth semiconductor insert layer 42. Then unnecessary portions of the stacked thin films formed on the GaAs substrate were removed by the photolithography process to form a resist pattern for producing the active region 11. Thereafter, the assembly was etched with an $H_3PO_4:H_2O_2$ system etchant to form the active region 11 having a mesa structure. Then, a 3,000 Å thick SiN film was formed by the plasma CVD process, and the SiN film was etched using a reactive ion etching apparatus, remaining portions corresponding to the side walls 9. Subsequently, a resist pattern for ohmic electrodes was formed, and then, only parts of the GaAsSb (the fourth semiconductor insert layer 42) and the AlGaAsSb (the second compound semiconductor layer 4) immediately under the source electrode 5 and the drain electrode 7 were etched using an $NH_4OH:H_2O_2$ system etchant, thereby exposing the surface of the InAs layer 3. Subsequently, a 1,500 Å thick Ti layer and a 2,500 Å thick Au layer were continuously deposited by the vacuum evaporation process. Then, the source electrode 5 and the drain electrode 7 were formed by the lift-off technique. Further, the gate electrode 6 was formed by forming a resist pattern for the gate electrode 6, by etching the GaAsSb layer (the fourth semiconductor insert layer 42) with an $NH_4OH:H_2O_2$ system etchant, and by depositing a 3,000 Å thick Al layer on the entire surface of the wafer, followed by performing the lift-off process. The wafer was cut into discrete devices by dicing. Thus, the FET according to the present invention as shown in FIG. 18 was fabricated.

[Trial Production Example 6]

Figure 19:
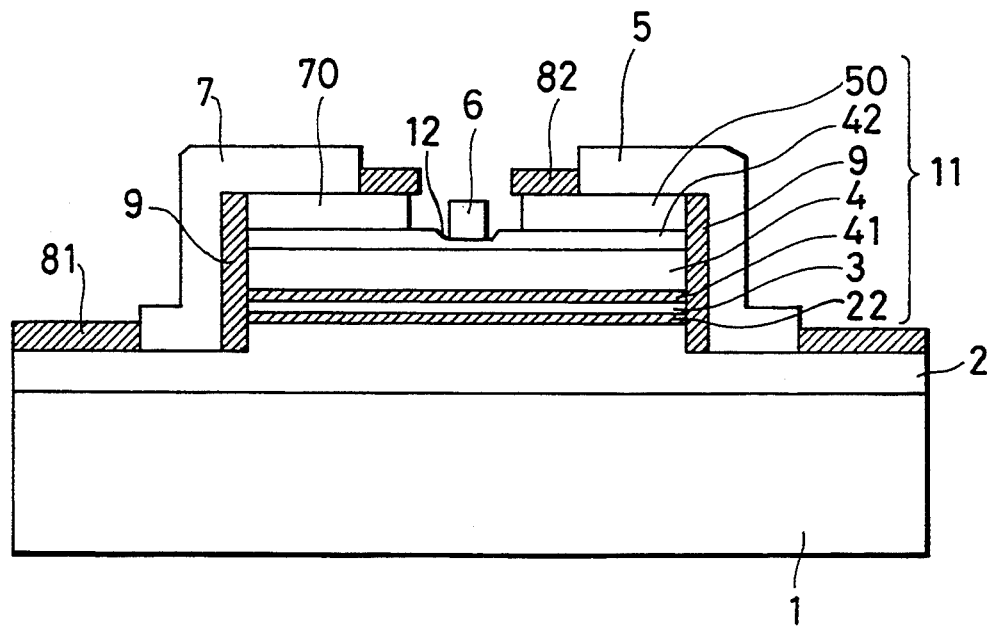
FIG. 19 is a cross sectional view showing the structure of the FET prepared in Trial Production Example 6.

In this example, the production of a variation of the FET shown in FIG. 19 will be detailed. In this Trial Production Example, both second compound semiconductor layer 4 and InAs layer 3 are doped with donor impurities, and accordingly, conduction electrons originated from the donor impurities in the InAs layer 3 and those supplied from the second compound semiconductor layer 4 are present in the InAs layer 3. The device herein produced further comprises the second semiconductor layer 22, the third semiconductor insert layer 41, the fourth semiconductor insert layer 42, the contact layers 50 and 70, the first protective film 81, the second protective film 82 and the side walls 9.

On the 350 μm thick semi-insulating GaAs substrate 1 having a mirror polished plane (100), the following layers were sequentially formed using the molecular beam epitaxy technique: a 10,000 Å thick non-doped layer of $Al_{0.7}Ga_{0.3}As_{0.15}Sb_{0.85}$, which was in the lattice matching with InAs, and serves as the first compound semiconductor layer 2; a 20 Å thick $Al_{0.7}Ga_{0.3}Sb$ layer as the second semiconductor insert layer 22; and a 500 Å thick InAs layer 3 which was doped with Si and had a carrier concentration of $5 \times 10^{17}/cm^3$. Then, a 20 Å thick $Al_{0.7}Ga_{0.3}Sb$ layer was grown as the third semiconductor insert layer 41, and thereafter, a layer of $Al_{0.7}Ga_{0.3}As_{0.15}Sb_{0.85}$ which was doped with Se at a concentration of $1 \times 10^{18}/cm^3$ was formed as the second compound semiconductor layer 4. Further, a 100 Å thick $GaAs_{0.15}Sb_{0.85}$ layer as the fourth semiconductor insert layer 42, and a 100 Å thick InAs layer to be formed into the contact layers 50 and 70 were sequentially formed on the second compound semiconductor layer 4. Subsequently, unnecessary portions of the stacked thin films formed on the GaAs substrate 1 were removed by the photolithography process to form a resist pattern for producing the active region 11. Thereafter, the assembly was etched with an $H_2SO_4:H_2O$ system etchant to form the active region 11 having a mesa structure. Then, a 2,000 Å thick SiN film was formed on the entire surface by the plasma CVD process to simultaneously form the first protective film 81, the second protective film 82 and the side walls 9. Then, after forming a resist pattern, portions, other than the side walls 9, of the SiN film on which the source electrode 5 and the drain electrode 7 were to be subsequently formed were removed by the anisotropic etching using a reactive ion etching apparatus. Subsequently, a 2,000 Å thick AuGe (Au:Ge=88:12) layer, a 500 Å thick Ni layer, and a 3,500 Å thick Au layer were continuously deposited by the vacuum evaporation method. Then, the patterns of the source electrode 5 and the drain electrode 7 were formed by the lift-off technique. After that, the assembly was annealed to form the ohmic junctions between the source and drain electrodes and the channel layer 3. Further, a resist pattern for the gate electrode 6 was formed, followed by the anisotropical etching of the portions, other than the portions for the side walls 9, of the SiN film on which the gate electrode 6 was to be subsequently formed by using a reactive ion etching apparatus. Further, by using this pattern, the InAs layers 50 and 70 and the GaAsSb layer 42 on the surface were etched with an $NH_4OH:H_2O_2$ system etchant to form the recess structure 12 on the AlGaAsSb layer, i.e., the second compound semiconductor layer 4. Then, a 3,000 Å thick Al layer was deposited on the entire surface of the wafer, and then, a lift-off process was performed to form the gate electrode 6 having a gate length of 1.0 μm. The wafer was cut into discrete devices by dicing, thereby fabricating the FET according to the present invention as shown in FIG. 19.

[Trial Production Example 7]

Figure 20:
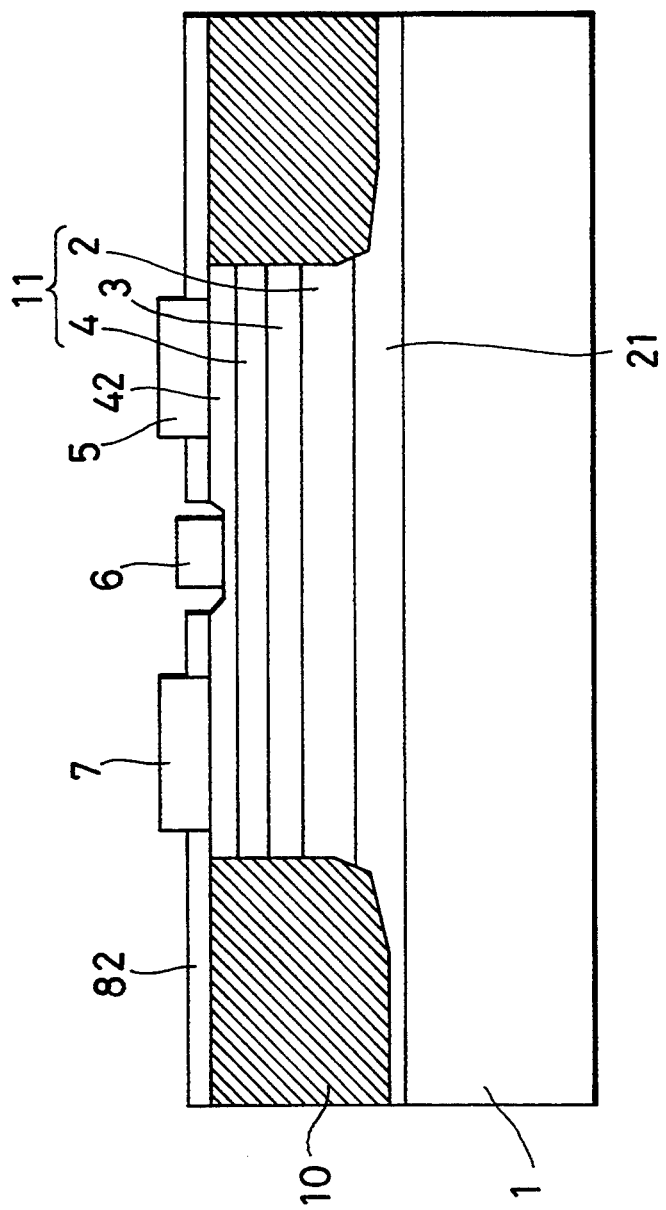
FIG. 20 is a cross sectional view showing the structure of the FET prepared in Trial Production Example 7.

In this example, the production of another variation of the FET shown in FIG. 20 will be detailed. In this Trial Production Example, a part of the InAs layer 3 is replaced with Ga to from a channel layer, and the thickness of the InAs layer 3 is made 70 Å. Therefore, quantum levels are formed by conduction electrons. Moreover, discrete devices are isolated by regions 10 formed by ion-implantation.

On a 400 μm thick p-type Si substrate 1 having a mirror polished (100) plane, the following layers were formed by the molecular beam epitaxy process: a 3,000 Å thick non-doped GaAs layer as the first semiconductor insert layer 21; a, 5,000 Å thick non-doped layer of $Al_{0.7}Ga_{0.3}As_{0.15}Sb_{0.85}$, which was in the lattice matching with InAs, and serves as the first compound semiconductor layer 2; a 70 Å thick InAs layer 3 in which 9% of In present in the InAs layer 3 was replaced with Ga; a 300 Å thick non-doped $Al_{0.7}Ga_{0.3}As_{0.15}Sb_{0.85}$ layer as the second compound semiconductor layer 4; and finally, a 100 Å thick $GaAs_{0.15}Sb_{0.85}$ layer as the fourth semiconductor insert layer 42. Further, a 1,000 Å thick SiN layer was grown on the entire surface of the substrate as the second protective layer 82 by the plasma CVD technique. Then, a resist pattern for forming the active region 11 of the FET was formed, followed by the ion-implantations of protons to the entire surface, thereby making the unnecessary portions 10 non-conductive (increasing the resistance sharply). The source electrode 5 and the drain electrode 7 were produced as follows. After forming a resist pattern, the SiN film was partially removed by the reactive ion etching, and then, a 2,000 Å thick AuGe (Au:Ge=88:12), a 500 Å thick Ni layer and a 3,500 Å thick Au layer were continuously deposited by the vacuum evaporation method. Then, the patterns of the source electrode 5 and the drain electrode 7 were formed by the lift-off process. Thereafter, the assembly was annealed to obtain the ohmic junctions between the electrode metals and the channel layer. After a resist pattern for the gate electrode 6 was formed, and the SiN film was partially removed by the reactive ion etching technique, a 500 Å thick Ti layer, a 500 Å thick Pt layer and a 1,000 Å thick Au layer were continuously vapor-deposited on the whole surface of the wafer, followed by the lift-off process to form the gate electrode 6. Finally, the wafer was cut into discrete devices by dicing, thus fabricating the device according to the present invention having the structure shown in FIG. 20. This device was provided with leads and then packaged by to the usual process.

[Trial Product ion Example 8]

Figure 21:
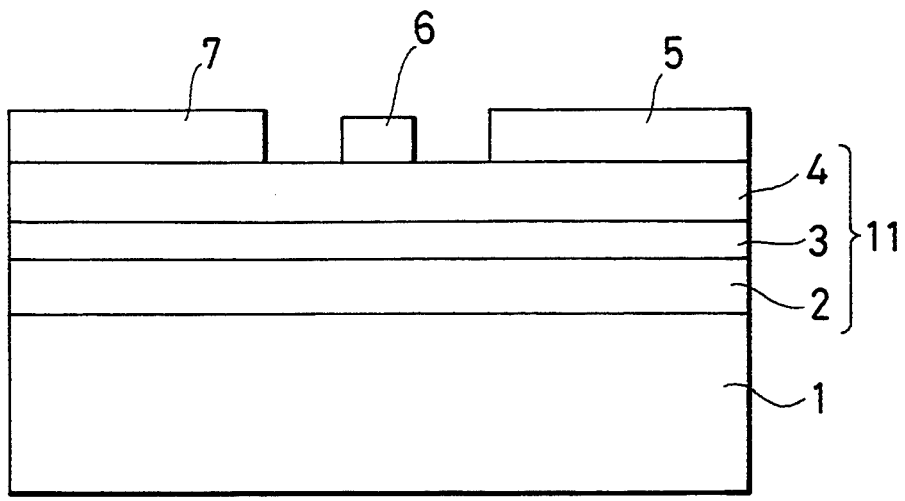
FIG. 21 is a cross sectional view showing the structure of the FET prepared in Trial Production Examples 8 to 11.

In this example, an example of the FET according to the present invention as shown in FIG. 21 will be detailed below. A 3,000 Å thick non-doped GaAs layer was formed on the 350 μm thick semi-insulating GaAs substrate having a mirror polished (100) plane by the molecular beam epitaxy technique, thereby forming the substrate 1 of the present invention. On the substrate, were formed a 1,500 Å thick non-doped layer of $AlAs_{0.15}Sb_{0.85}$ which was in the lattice matching with InAs, a 700 Å thick non-doped InAs layer 3 and a non-doped $AlAs_{0.15}Sb_{0.85}$ layer 4. Then, unnecessary portions of the stacked film formed on the GaAs substrate 1 were removed by the photolithography process, followed by the formation of the resist pattern used for forming the active region 11 of the FET. Thereafter, the mesa etching using an $H_2SO_4:H_2O$ system etchant was performed to remove the unnecessary portions. Then, after a resist pattern was formed, a 2000 Å thick AuGe layer (Au:Ge=88:12), a 500 Å thick Ni layer and a 3,500 Å thick Au layer were continuously deposited by the vacuum evaporation method. Then, a lift-off process was performed to form patterns for the source electrode 5 and drain electrode 7. Thereafter, the assembly was annealed at 450° C. for 5 minutes under nitrogen atmosphere in an electric furnace to form the ohmic junctions between the source and drain electrodes and the InAs layer 3. Further, the gate electrode 6 having a gate length of 1.0 μm was formed by forming a resist pattern for the gate electrode 6, by vapor-depositing a 3,000 Å thick Al film on the whole surface of the wafer, and then, by performing a lift-off process. Finally, an SiN protective film was formed on the whole surface of the wafer by the plasma CVD technique using silane gas and ammonia gas. Then, a desired resist pattern was formed, and the windows for bonding were formed in the electrode portions by the reactive ion etching technique. Subsequently, the wafer was cut into discrete devices by dicing, thus fabricating the device according to the present invention as shown in FIG. 21. This device was provided with leads and then packaged through the usual process.

It was found that the FET in accordance with the present invention has a large cut-off frequency due to the high electron mobility of InAs, and is superior in high speed operation as compared with the conventional GaAs FET when it has a gate length equal to that of the GaAs-FET.

[Trial Production Example 9]

In this example, an example of another variation of the FET according to the present invention as shown in FIG. 21 will be explained. A 3,000 Å thick non-doped GaAs layer was formed on the 350 μm thick semi-insulating GaAs substrate having a mirror polished (100) plane by the molecular beam epitaxy technique, thereby forming the substrate 1. On the substrate, were formed a 1,500 Å thick non-doped $AlAs_{0.15}Sb_{0.85}$ layer 2 which was in the lattice matching with InAs, a 700 Å thick non-doped InAs layer 3 and an $AlAs_{00.15}Sb_{0.85}$ layer 4 doped with Si at a concentration of $1\times10^{18}/cm^3$. After that, the same procedures used in Trial Production Example 8 were repeated to fabricate a device shown in FIG. 21 according to the present invention.

[Trial Production Example 10]

In this example, an example of a further variation of the FET according to the present invention as shown in FIG. 21 will be explained. A 3,000 Å thick non-doped GaAs layer was formed on the 350 μm thick semi-insulating GaAs substrate having a mirror polished (100) plane by the molecular beam epitaxy technique, thereby forming the substrate 1. On the substrate, were formed a 500 Å thick non-doped $AlAs_{0.15}Sb_{0.85}$ layer 2 which was in the lattice matching with InAs, a 700 Å thick InAs layer 3 doped with Si and having a carrier concentration of $1\times10^{17}/cm^3$ and an electron mobility of 14,000 $cm^2/v\cdot sec$, and an $AlAs_{0.15}Sb_{0.85}$ layer 4 doped with Si at a concentration of $1\times10^{18}/cm^3$. After that, the same procedures used in Trial Production Example 8 were repeated to fabricate a device shown in FIG. 21 according to the present invention.

[Trial Production Example 11]

In this example, an example of a still further variation of the FET according to the present invention as shown in FIG. 21 will be explained. A 3,000 Å thick non-doped GaAs layer was formed on the 350 μm thick semi-insulating GaAs substrate having a mirror polished (100) plane by the molecular beam epitaxy technique, thereby forming the substrate 1. On the substrate, were formed a 1,500 Å thick non-doped AlAs$_{0.15}$Sb$_{0.85}$ layer 2 which was in the lattice matching with InAs, a 100 Å thick InAs layer 3, and a non-doped AlAs$_{0.15}$Sb$_{0.85}$ layer 4. This device was provided with leads and then packaged in the usual process. After that, the same procedures used in Trial Production Example 8 were repeated to fabricate a device shown in FIG. 21 according to the present invention.

[Trial Production Example 12]

Figure 22:
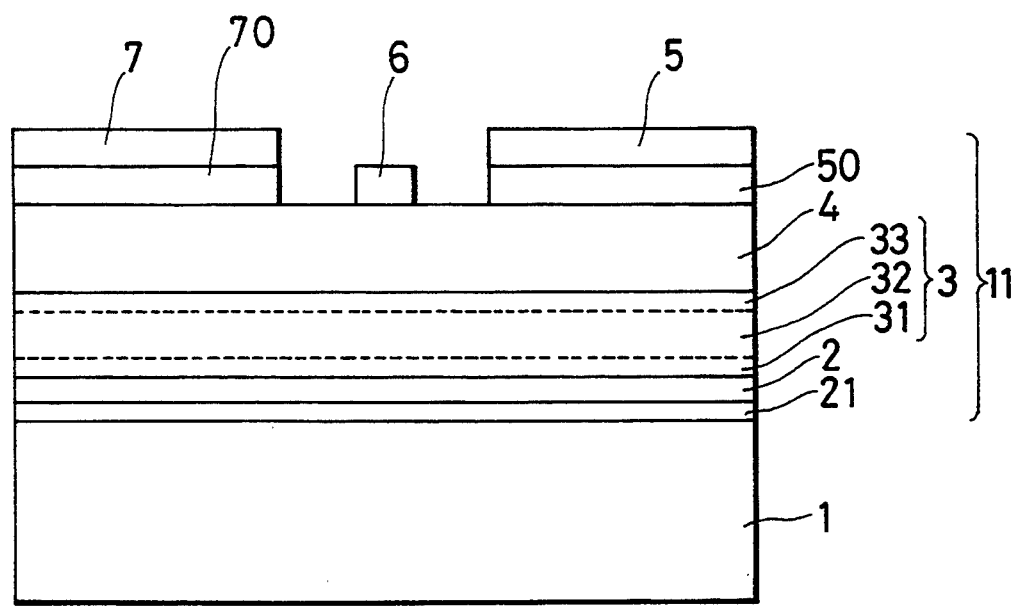
FIG. 22 is a cross sectional view showing the structure of the FET prepared in Trial Production Example 12.

In this example, an example of the FET according to the present invention as shown in FIG. 22 will be explained. A 3,000 Å thick non-doped layer was formed on the 350 μm thick semi-insulating GaAs substrate having a mirror polished (100) plane by the molecular beam epitaxy technique, thus forming the substrate 1. On the substrate, were formed a 500 Å thick In$_{0.53}$Ga$_{0.47}$As 21, and a 500 Å thick non-doped Ga$_{0.7}$Al$_{0.3}$As$_{0.15}$Sb$_{0.85}$ layer 2 which was in the lattice matching with InAs. Subsequently, the InAs layer 3 is formed comprising a 100 Å thick non-doped InAs layer 31, a 500 Å thick InAs layer 32 doped with Si and a 100 Å thick non-doped InAs layer 33, followed by the formation of a non-doped AlAs$_{0.15}$Sb$_{0.85}$ layer 4. Finally, a 200 Å thick InAs layer was formed which was to be subsequently shaped into the contact layers 50 and 70 doped with Si at a concentrations of $5 \times 10^{18}$/cm$^3$. Then, unnecessary portions of the stacked films formed on the GaAs substrate 1 were removed by the photolighography process to form a resist pattern used for fabricating the active region 11 of the FET. Thereafter, etching using an H$_2$SO$_4$:H$_2$O system etchant was performed to remove the unnecessary portions. Then, a resist pattern was formed, followed by the continuous vapor deposition of a 2,000 Å thick AuGe layer (Au:Ge=88:12), a 500 Å thick Ni layer and a 3,500 Å thick Au layer by the vacuum evaporation method. Then, the lift-off process was performed to form patterns for the source electrode 5 and the drain electrode 7. Thereafter, the assembly was annealed at 450° C. for 5 minutes under nitrogen atmosphere in an electric furnace to form the ohmic junctions between these metal electrodes and the channel layer. After removing the resist, etching using an H$_2$SO$_4$:H$_2$O system etchant was performed to remove the InAs layer except for the portions under the source and drain electrodes by using both the electrodes as masks. Further, the gate electrode 6 having a gate length of 1.0 μm was formed by forming a resist pattern for the gate electrode 6, by vapor-depositing 3,000 Å thick Al film on the whole surface of the wafer, and by performing the lift-off process. Finally, a passivation film of SiN was formed on the whole surface of the wafer by the plasma CVD technique using silane gas and ammonia gas. Then a desired resist pattern was formed, and windows for bonding were formed in the electrode portions by the reactive ion etching technique. Subsequently, the wafer was cut into discrete devices by dicing, thus fabricating the device according to the present invention as shown in FIG. 22. This device was provided with leads and then packaged in the usual process.

The devices obtained in these Trial Production Examples had very good characteristics. An example thereof is shown in FIG. 23.

Figure 1C:
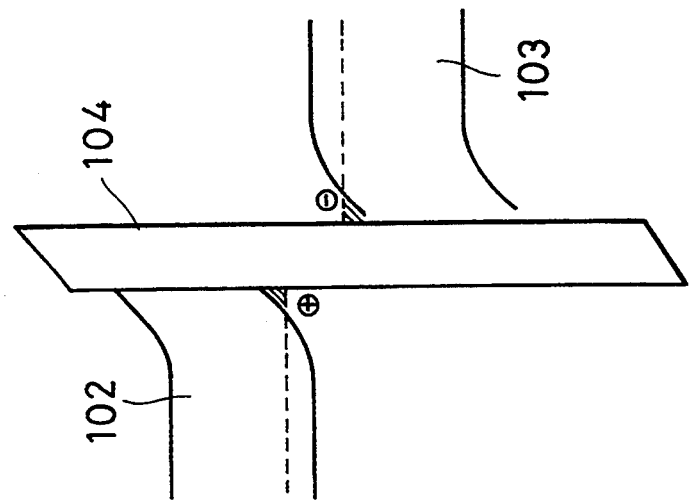
Figure 1B:
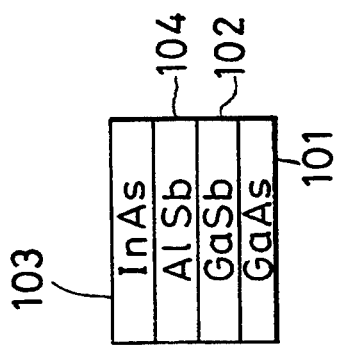
Figure 1A:
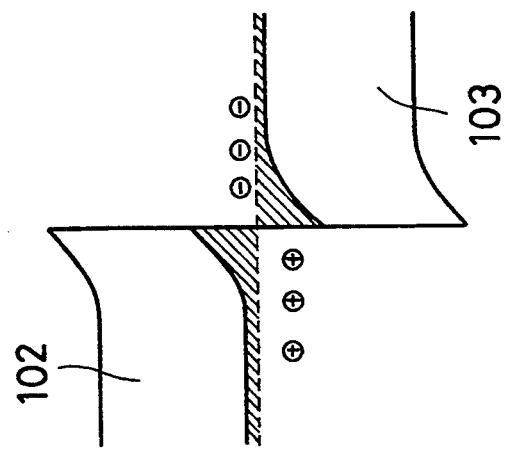
Figure 2A:
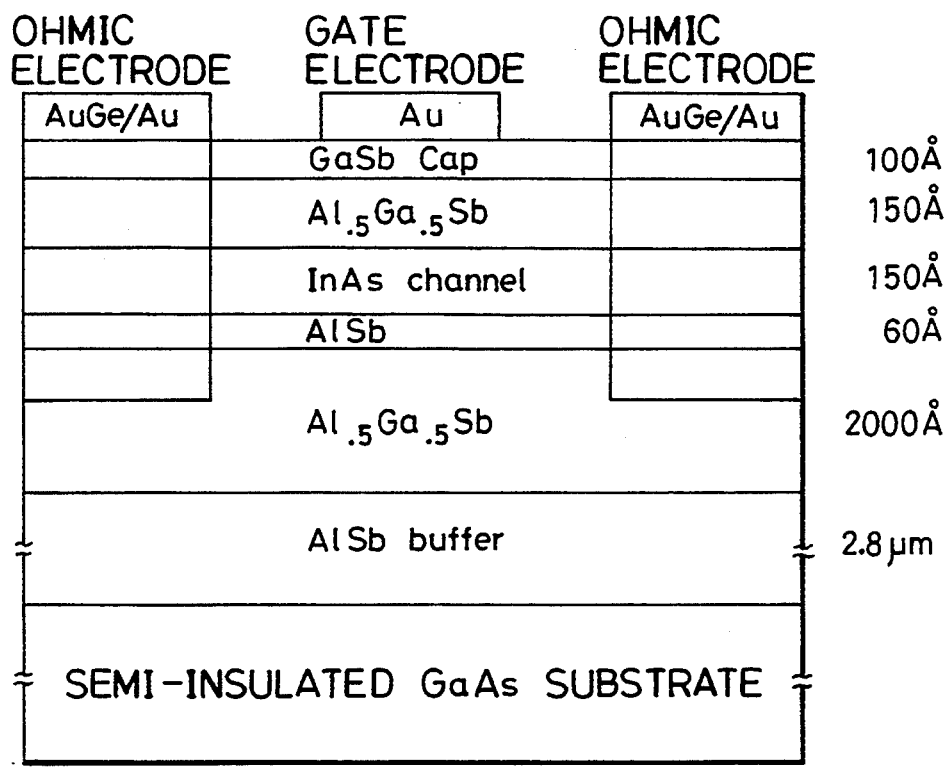
FIG. 2A is a cross sectional view of a conventional InAs-FET shown in IEEE EDL, 1990, Vol. 11, No. 11, p. 526
Figure 2B:
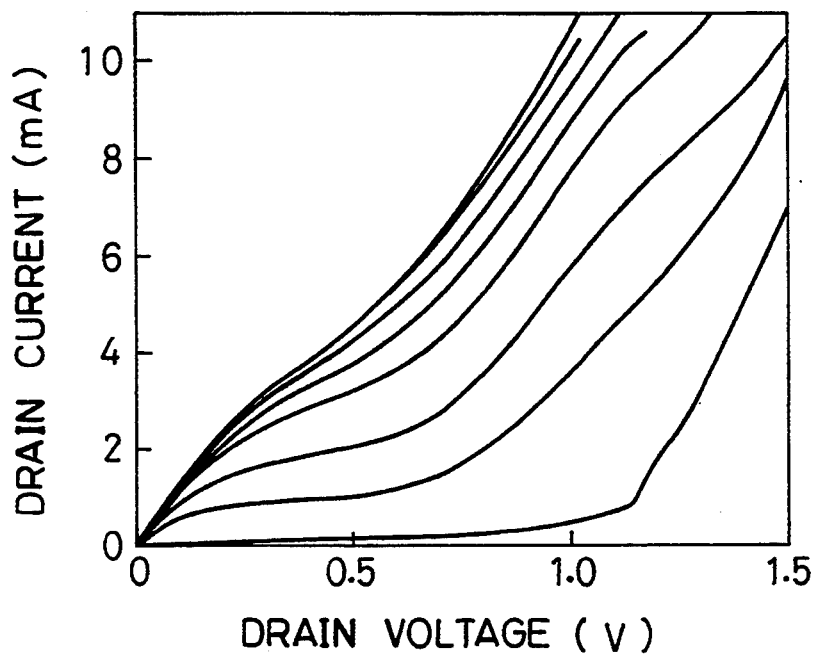
FIG. 2B is a graph showing IV characteristics thereof.
Figure 23:
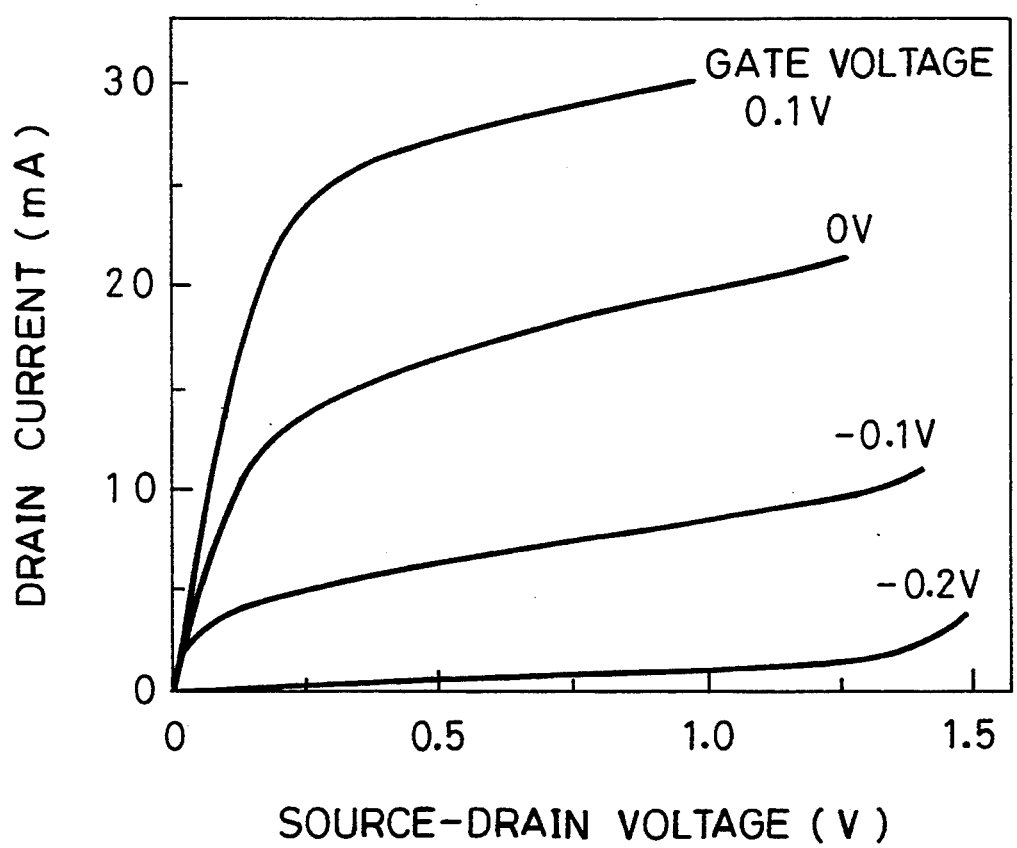
FIG. 23 is a graph showing the IV characteristics of the FET obtained according to Trial Production Example 5.

FIG. 23 is a graph showing the relationship between the source-drain voltage versus the drain current measured when the gate voltage of the FET obtained in Trial Production Example 5 is changed at room temperature. FIG. 23 indicates that the drain current is accurately controlled by the voltage applied to the gate electrode 6 unlike the conventional InAs-FET shown in FIG. 2, and that the FET exhibits a low leakage current and good FET characteristics. Good results were also obtained for other devices according to the present invention obtained in the other Trial Production Examples.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

INDUSTRIAL APPLICABILITY

The present invention serves to provide high-speed devices for transmitting and receiving amplification in the satellite broadcasting, and for high speed data transmission. It also helps to reduce the cost, and to increase the functions of these devices. Furthermore, it facilitates the fabrication of the high-frequency devices by using the micro-fabrication technique, thus achieving higher-speed devices.

We claim:

1. A field effect transistor comprising:
    a substrate having a lattice constant different from that of InAs;
    a first compound semiconductor layer which is disposed on the surface of the substrate, and comprises at least one layer of film selected from the group consisting of thin films which have compositions defined by the following formulae, and are in substantial lattice matching with InAs,
    Al$_{x1}$Ga$_{1-x1}$As$_{y1}$Sb$_{1-y1}$ wherein $\{0.21 \leq x1 \leq 1.0; 0.02 \leq y1 \leq 0.22\}$,
    Al$_{x2}$In$_{1-x2}$As$_{y2}$Sb$_{1-y2}$ wherein $\{0.34 \leq x2 \leq 1.0; 0.09 \leq y2 \leq 0.79\}$,
    Al$_{x3}$In$_{1-x3}$P$_{y3}$Sb$_{1-y3}$ wherein $\{0.07 \leq x3 \leq 1.0; 0.06 \leq y3 \leq 0.72\}$, and
    Al$_{x4}$Ga$_{1-x4}$P$_{y4}$Sb$_{1-y4}$ wherein $\{0.13 \leq x4 \leq 1.0; 0.01 \leq y4 \leq 0.18\}$;
    an InAs layer disposed on the first compound semiconductor layer;
    a second compound semiconductor layer which is disposed on the InAs layer, which is in substantial lattice matching with InAs in the InAs layer and which has a bandgap greater than that of the InAs layer;
    at least one pair of electrodes which make ohmic contact with the InAs layer; and
    at least one gate electrode for controlling an electric current in the InAs layer, said gate electrode being disposed between the pair of ohmic electrodes and on the second compound semiconductor layer.

2. The field effect transistor as claimed in claim 1, wherein the difference between the lattice constant of the substrate and that of InAs of the InAs layer is 3.5% or higher.

3. The field effect transistor as claimed in claim 1, wherein the first compound semiconductor layer comprises at least one layer of film selected from the group consisting of thin films which have composition defined by the following formulae, and are in substantial lattice matching with InAs, $Al_{x1}Ga_{1-x1}As_{y1}Sb_{1-y1}$ wherein $\{0.21 \leq x1 \leq 1.0; 0.09 \leq x1 \leq y1 \leq 0.07x1+0.15\}$, $Al_{x2}In_{1-x2}As_{y2}Sb_{1-y2}$ wherein $\{0.34 \leq x2 \leq 1.0; -0.82x2+0.91 \leq y2 \leq -0.87x2+1.09\}$, $Al_{x3}In_{1-x3}P_{y3}Sb_{1-y3}$ wherein $\{0.07 \leq x3 \leq 1.0; -0.57x3+0.63 \leq y3 \leq -0.58x3+0.76\}$, and $Al_{x4}Ga_{1-x4}P_{y4}Sb_{1-y4}$ wherein $\{0.13 \leq x4 \leq 1.0; 0.06x4 \leq y4 \leq 0.06x4+0.12\}$.

4. The field effect transistor as claimed in claim 1, wherein the first compound semiconductor layer comprises at least one layer of film selected from the group consisting of thin films which have composition defined by the following formulae, and are in substantial lattice matching with InAs, $Al_{x1}Ga_{1-x1}As_{y1}Sb_{1-y1}$ wherein $\{0.21 \leq x1 \leq 1.0; 0.08x1+0.03 \leq y1 \leq 0.08x1+0.12\}$, $Al_{x2}In_{1-x2}As_{y2}Sb_{1-y2}$ wherein $\{0.34 \leq x2 \leq 1.0; -0.83x2+0.94 \leq y2 \leq -0.86x2+1.06\}$, $Al_{x3}In_{1-x3}P_{y3}Sb_{1-y3}$ wherein $\{0.07 \leq x3 \leq 1.0; -0.57x3+0.65 \leq y3 \leq -0.58x3+0.74\}$, and $Al_{x4}Ga_{1-x4}P_{y4}Sb_{1-y4}$ wherein $\{0.13 \leq x4 \leq 1.0; 0.06x4+0.02 \leq y4 \leq 0.06x4+0.10\}$.

5. The field effect transistor as claimed in claim 1, wherein the first compound semiconductor layer comprises at least one layer of film selected from the group consisting of thin films which have composition defined by the following formulae, and are in substantial lattice matching with InAs, $Al_{x1}Ga_{1-x1}As_{y1}Sb_{1-y1}$ wherein $\{0.21 \leq x1 \leq 1.0; 0.08x1+0.05 \leq y1 \leq 0.08x1+0.10\}$, $Al_{x2}In_{1-x2}As_{y2}Sb_{1-y2}$ wherein $\{0.34 \leq x2 \leq 1.0; -0.84x2+0.97 \leq y2 \leq -0.85x2+1.03\}$, $Al_{x3}In_{1-x3}P_{y3}Sb_{1-y3}$ wherein $\{0.07 \leq x3 \leq 1.0; -0.57x3+0.67 \leq y3 \leq -0.57x3+0.72\}$, and $Al_{x4}Ga_{1-x4}P_{y4}Sb_{1-y4}$ wherein $\{0.13 \leq x4 \leq 1.0; 0.06x4+0.04 \leq y4 \leq 0.06x4+0.08\}$.

6. The field effect transistor as claimed in claim 1, wherein the second compound semiconductor layer comprises at least one layer of film selected from the group consisting of thin films which have composition defined by the following formulae, and are in substantial lattice matching with InAs, $Al_{x1}Ga_{1-x1}As_{y1}Sb_{1-y1}$ wherein $\{0.21 \leq x1 \leq 1.0; 0.02 \leq y1 \leq 0.22\}$, $Al_{x2}In_{1-x2}As_{y2}Sb_{1-y2}$ wherein $\{0.34 \leq x2 \leq 1.0; 0.09 \leq y2 \leq 0.79\}$, $Al_{x3}In_{1-x3}P_{y3}Sb_{1-y3}$ wherein $\{0.07 \leq x3 \leq 1.0; 0.06 \leq y3 \leq 0.72\}$, and $Al_{x4}Ga_{1-x4}P_{y4}Sb_{1-y4}$ wherein $\{0.13 \leq x4 \leq 1.0; 0.01 \leq y4 \leq 0.18\}$.

7. The field effect transistor as claimed in claim 1, wherein the second compound semiconductor layer comprises at least one layer of film selected from the group consisting of thin films which have composition defined by the following formulae, and are in substantial lattice matching with InAs, $Al_{x1}Ga_{1-x1}As_{y1}Sb_{1-y1}$ wherein $\{0.21 \leq x1 \leq 1.0; 0.09x1 \leq y1 \leq 0.07x1+0.15\}$, $Al_{x2}In_{1-x2}As_{y2}Sb_{1-y2}$ wherein $\{0.34 \leq x2 \leq 1.0; -0.82x2+0.91 \leq y2 \leq -0.87x2+1.09\}$, $Al_{x3}In_{1-x3}P_{y3}Sb_{1-y3}$ wherein $\{0.07 \leq x3 \leq 1.0; -0.57x3+0.63 \leq y3 \leq -0.58x3+0.76\}$, and $Al_{x4}Ga_{1-x4}P_{y4}Sb_{1-y4}$ wherein $\{0.13 \leq x4 \leq 1.0; 0.06x4 \leq y4 \leq 0.06x4+0.12\}$.

8. The field effect transistor as claimed in claim 1, wherein the second compound semiconductor layer comprises at least one layer of film selected from the group consisting of thin films which have composition defined by the following formulae, and are in substantial lattice matching with InAs, $Al_{x1}Ga_{1-x1}As_{y1}Sb_{1-y1}$ wherein $\{0.21 \leq x1 \leq 1.0; 0.08x1+0.03 \leq y1 \leq 0.08x1+0.12\}$, $Al_{x2}In_{1-x2}As_{y2}Sb_{1-y2}$ wherein $\{0.34 \leq x2 \leq 1.0; -0.83x2+0.94 \leq y2 \leq -0.86x2+1.06\}$, $Al_{x3}In_{1-x3}P_{y3}Sb_{1-y3}$ wherein $\{0.07 \leq x3 \leq 1.0; -0.57x3+0.65 \leq y3 \leq -0.58x3+0.74\}$, and $Al_{x4}Ga_{1-x4}P_{y4}Sb_{1-y4}$ wherein $\{0.13 \leq x4 \leq 1.0; 0.06x4+0.02 \leq y4 \leq 0.06x4+0.10\}$.

9. The field effect transistor as claimed in claim 1, wherein the second compound semiconductor layer comprises at least one layer of film selected from the group consisting of thin films which have composition defined by the following formulae, and are in substantial lattice matching with InAs, $Al_{x1}Ga_{1-x1}As_{y1}Sb_{1-y1}$ wherein $\{0.21 \leq x1 \leq 1.0; 0.08x1+0.05 \leq y1 \leq 0.08x1+0.10\}$, $Al_{x2}In_{1-x2}As_{y2}Sb_{1-y2}$ wherein $\{0.34 \leq x2 \leq 1.0; -0.84x2+0.97 \leq y2 \leq -0.85x2+1.03\}$, $Al_{x3}In_{1-x3}P_{y3}Sb_{1-y3}$ wherein $\{0.07 \leq x3 \leq 1.0; -0.57x3+0.67 \leq y3 \leq -0.58x3+0.72\}$, and $Al_{x4}Ga_{1-x4}P_{y4}Sb_{1-y4}$ wherein $\{0.13 \leq x4 \leq 1.0; 0.06x4+0.04 \leq y4 \leq 0.06x4+0.08\}$.

10. The field effect transistor as claimed in claim 1, wherein at least a part of the InAs layer is doped with impurities.

11. The field effect transistor as claimed in claim 1, wherein at least a part of the second compound semiconductor layer are doped with impurities.

12. The field effect transistor as claimed in claim 1, wherein at least a part of the InAs layer and at least a part of the second compound semiconductor layer are doped with impurities.

13. The field effect transistor as claimed in any one of claims 1-12, wherein the pair of ohmic electrodes make ohmic contact with the InAs layer through the second compound semiconductor layer formed on the InAs layer.

14. The field effect transistor as claimed in any one of claims 1-12, further comprising a semiconductor contact layer between the ohmic electrodes and the second compound semiconductor layer.

15. The field effect transistor as claimed in any one of claims 1-12, wherein the second compound semiconductor layer, except for a portion below the gate electrode, is implanted with donor impurities at a concentration ranging from $3 \times 10^{17}/cm^3$ to $10^{19}/cm^3$.

16. The field effect transistor as claimed in any one of claims 1-12, wherein the gate electrode has a stacked structure comprising a conductive semiconductor and a metal.

17. The field effect transistor as claimed in any one of claims 1-12, wherein the second compound semiconductor layer has a recess structure at a portion where the gate electrode makes contact with the second compound semiconductor layer.

18. The field effect transistor as claimed in any one of claims 1-12, further comprising a first semiconductor insert layer made of a compound semiconductor between the substrate and the first compound semiconductor layer.

19. The field effect transistor as claimed in any one of claims 1-12, further comprising, between the substrate and the first compound semiconductor layer, a first semiconductor insert layer made of a semiconductor whose lattice constant differs from that of InAs in the InAs layer by 3.5% or higher.

20. The field effect transistor as claimed in any one of claims 1-12, further comprising, between the first compound semiconductor layer and the InAs layer, a semiconductor insert layer whose thickness is less than a critical film thickness of the semiconductor insert layer on the first compound semiconductor layer.

21. The field effect transistor as claimed in any one of claims 1-12, further comprising, between the first compound semiconductor layer and the InAs layer, a semiconductor insert layer whose thickness is less than a critical film thickness of the semiconductor insert layer on InAs of the InAs layer.

22. The field effect transistor as claimed in any one of claims 1-12, further comprising, between the gate electrode and the second compound semiconductor layer, a semiconductor insert layer which has an electron affinity smaller than the work function of the gate electrode, and which has a sum of an electron affinity and a bandgap greater than the work function of the gate electrode.

23. The field effect transistor as claimed in any one of claims 1-12, wherein the gate electrode and the second compound semiconductor layer from a Schottky junction.

24. The field effect transistor as claimed in any one of claims 1-12, further comprising an insulating layer between the gate electrode and the second compound semiconductor layer.

25. The field effect transistor as claimed in any one of claims 1-12, wherein the gate electrode is adjacent to at least a part of the section of the InAs layer via side walls composed of an insulating film at the periphery of an active region of the field effect transistor, and wherein the gate electrode and the InAs layer are electrically insulated from each other.

26. The field effect transistor as claimed in any one of claims 1-12, wherein the first compound semiconductor layer has a protective film on its top surface for preventing oxidation.

27. The field effect transistor as claimed in any one of claims 1-12, wherein the second compound semiconductor layer has a protective film on its top surface for preventing oxidation.

28. The field effect transistor as claimed in any one of claims 1-12, wherein the InAs layer has a thickness equal to or less than 400 Å.

29. The field effect transistor as claimed in any one of claims 1-12, wherein the InAs layer has a thickness equal to or less than 200 Å.

30. The field effect transistor as claimed in any one of claims 1-12, wherein at least a part of the first compound semiconductor layer is doped with impurities.

31. The field effect transistor as claimed in any one of claims 1-12, wherein the the second compound semiconductor layer is a substantial semi-insulator.

32. The field effect transistor as claimed in any one of claims 1-12, wherein the InAs layer is doped with Ga to an amount equal to or less than 9% of In present in the InAs layer in terms of the atomic number ratio.

* * * * *

UNITED STATES PATENT AND TRADEMARK OFFICE
CERTIFICATE OF CORRECTION

PATENT NO. : 5,430,310
DATED : July 4, 1995
INVENTOR(S) : Ichiro SHIBASAKI et al.

It is certified that error appears in the above-indentified patent and that said Letters Patent is hereby corrected as shown below:

On the title page, change "[22] Filed: Nov. 25, 1992" to --[22] PCT Filed: Mar. 27, 1992--; and add --[86] PCT No.: PCT/JP92/00379
§ 371 date: Nov. 25, 1992
§ 102(e) date: Jan. 14, 1993--

Claim 3, col. 29, line 8, delete "$\leq x1$".

UNITED STATES PATENT AND TRADEMARK OFFICE
CERTIFICATE OF CORRECTION

PATENT NO. : 5,430,310
DATED : July 4, 1995
INVENTOR(S) : Ichiro SHIBASAKI et al.

It is certified that error appears in the above-indentified patent and that said Letters Patent is hereby corrected as shown below:

Claim 5, col. 29, line 39, change "$v^3$" to --$y^3$--. (both occurrences)

Claim 7, col. 29, line 67, change "$v^3$" (both occurrences) to --$y^3$--.

Claim 23, col. 31, line 31, change "from" to --form--.

Signed and Sealed this

Twenty-sixth Day of December, 1995

Attest:

BRUCE LEHMAN

Attesting Officer      Commissioner of Patents and Trademarks